(12) United States Patent
Koyanagi et al.

(10) Patent No.: US 11,145,629 B2
(45) Date of Patent: Oct. 12, 2021

(54) SEMICONDUCTOR DEVICE AND POWER CONVERSION DEVICE

(71) Applicant: ROHM CO., LTD., Ukyo-ku Kyoto (JP)

(72) Inventors: Shozo Koyanagi, Ukyo-ku Kyoto (JP); Seiji Nakashima, Ukyo-ku Kyoto (JP)

(73) Assignee: ROHM Co., Ltd., Kyoto (JP)

( * ) Notice: Subject to any disclaimer, the term of this patent is extended or adjusted under 35 U.S.C. 154(b) by 132 days.

(21) Appl. No.: 16/715,167

(22) Filed: Dec. 16, 2019

(65) Prior Publication Data

US 2020/0194405 A1 Jun. 18, 2020

(30) Foreign Application Priority Data

Dec. 17, 2018 (JP) .............................. JP2018-235262

(51) Int. Cl.
*H01L 25/07* (2006.01)
*H01L 23/495* (2006.01)
(Continued)

(52) U.S. Cl.
CPC ........ *H01L 25/072* (2013.01); *H01L 23/3121* (2013.01); *H01L 23/49513* (2013.01); *H01L 23/49517* (2013.01); *H01L 23/49541* (2013.01); *H01L 23/49575* (2013.01); *H01L 24/32* (2013.01); *H01L 25/16* (2013.01); *H02M 3/1588* (2013.01); *H05K 1/181* (2013.01); *H01L 24/48* (2013.01); *H01L 24/73* (2013.01); *H01L 2224/32245* (2013.01); *H01L 2224/48091* (2013.01); *H01L 2224/48106* (2013.01); *H01L 2224/48247* (2013.01); *H01L 2224/73265* (2013.01); *H01L 2924/13091* (2013.01);
(Continued)

(58) Field of Classification Search
CPC ..... H01L 2924/181; H01L 2924/13055; H01L 2224/49171; H01L 23/49575; H01L 23/49861; H01L 23/4951; H01L 23/49537
See application file for complete search history.

(56) References Cited

U.S. PATENT DOCUMENTS 7,633,140 B2 * 12/2009 Luo .................... H01L 24/73
257/666
8,679,896 B2 * 3/2014 Joshi .................. H01L 24/41
438/113

(Continued)

FOREIGN PATENT DOCUMENTS

JP 2013026316 A 2/2013

*Primary Examiner* — Jaehwan Oh
(74) *Attorney, Agent, or Firm* — Hamre, Schumann, Mueller & Larson, P.C.

(57) ABSTRACT

A semiconductor device, includes: first semiconductor element including first and second electrodes; second semiconductor element including third and fourth electrodes; sealing resin covering the semiconductor elements; first, second, third, and fourth terminal portions respectively connected to the first, second, third, and fourth electrodes and exposed from the sealing resin; first island portion where the first semiconductor element is mounted; and second island portion where the second semiconductor element is mounted, wherein four quadrants divided by first imaginary line extending along second direction orthogonal to first direction and second imaginary line extending along third direction orthogonal to both the first and second directions are defined.

24 Claims, 24 Drawing Sheets

(51) Int. Cl.
    *H01L 25/16*     (2006.01)
    *H05K 1/18*     (2006.01)
    *H01L 23/00*     (2006.01)
    *H02M 3/158*     (2006.01)
    *H01L 23/31*     (2006.01)

(52) U.S. Cl.
    CPC ............... *H05K 2201/1003* (2013.01); *H05K 2201/10015* (2013.01); *H05K 2201/10166* (2013.01); *H05K 2201/10522* (2013.01)

(56) References Cited

U.S. PATENT DOCUMENTS

| | | | |
|---|---|---|---|
| 9,673,143 B2 * | 6/2017 | Kamiyama | H01L 23/50 |
| 2010/0059875 A1 * | 3/2010 | Sato | H01L 24/33 |
| | | | 257/690 |
| 2010/0155915 A1 * | 6/2010 | Bell | H01L 29/402 |
| | | | 257/676 |
| 2011/0074007 A1 * | 3/2011 | Lopez | H01L 23/49568 |
| | | | 257/692 |
| 2011/0298115 A1 * | 12/2011 | Celaya | H01L 23/49575 |
| | | | 257/676 |
| 2016/0233204 A1 * | 8/2016 | Funatsu | H01L 23/3107 |
| 2020/0411422 A1 * | 12/2020 | Xue | H01L 21/565 |
| 2021/0082793 A1 * | 3/2021 | Zhang | H01L 23/4952 |
| 2021/0144888 A1 * | 5/2021 | Sano | H05K 7/20 |

\* cited by examiner

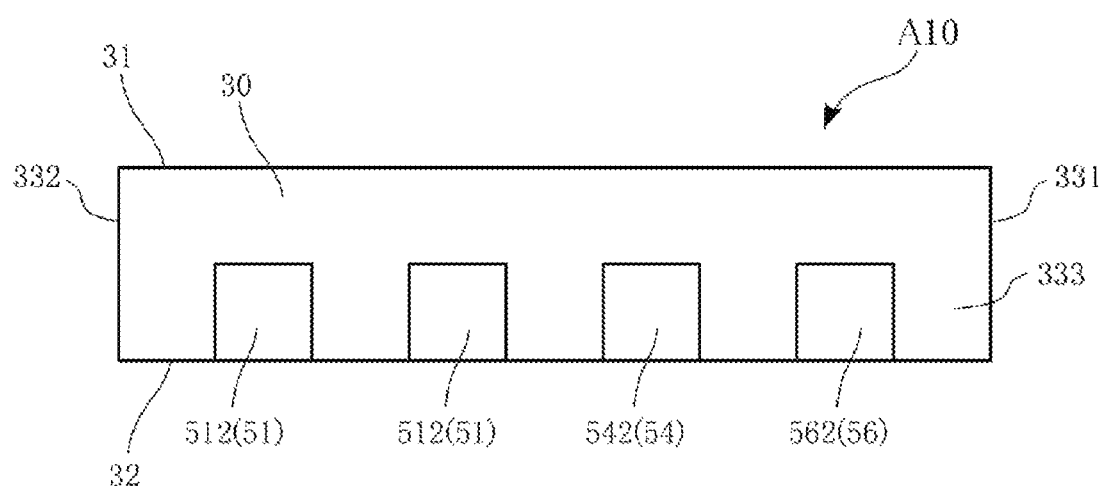
FIG. 3
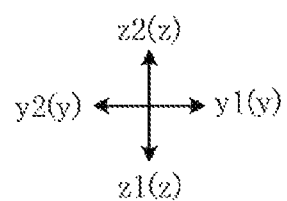

SEMICONDUCTOR DEVICE AND POWER CONVERSION DEVICE

CROSS-REFERENCE TO RELATED APPLICATION

This application is based upon and claims the benefit of priority from Japanese Patent Application No. 2018-235262, filed on Dec. 17, 2018, the entire contents of which are incorporated herein by reference.

TECHNICAL FIELD

The present disclosure relates to a semiconductor device in which two semiconductor elements are packaged in one sealing resin. The present disclosure also relates to a power conversion device provided with the semiconductor device.

BACKGROUND

In the related art, there is known a semiconductor device. The semiconductor device known in the related art includes a semiconductor chip, a sealing resin, and a lead frame. In the semiconductor chip, two element regions of MOSFETs (Metal-Oxide-Semiconductor Field-Effect Transistors) having the same configuration are formed on one substrate. On an upper surface of the semiconductor chip, a source electrode and a gate electrode of one MOSFET and a source electrode and a gate electrode of the other MOSFET are formed. In addition, the drain electrodes of the two MOSFETs are formed on a lower surface of the semiconductor chip. The sealing resin covers the semiconductor chip and a part of the lead frame. In other words, a part of the lead frame is exposed from the sealing resin. The lead frame includes a plurality of leads spaced apart from each other. The leads include a lead electrically connected to the source electrode of one MOSFET, a lead electrically connected to the gate electrode of one MOSFET, a lead electrically connected to the source electrode of the other MOSFET, a lead electrically connected to the gate electrode of the other MOSFET, and leads electrically connected to the drain electrodes of the two MOSFETs.

The aforementioned semiconductor device is used, for example, in a power conversion device that converts an input voltage into a predetermined output voltage. Examples of the power conversion device include a DC/DC converter, an AC/DC converter, and a DC/AC inverter.

SUMMARY

Some embodiments of the present disclosure provide a semiconductor device used for a power conversion device. In addition, some embodiments of the present disclosure provide a power conversion device including the semiconductor device.

According to an embodiment of the present disclosure, there is provided a semiconductor device. The device includes: a first semiconductor element including a first electrode and a second electrode; a second semiconductor element including a third electrode and a fourth electrode; a sealing resin configured to cover the first semiconductor element and the second semiconductor element; a first terminal portion electrically connected to the first electrode and exposed from the sealing resin; a second terminal portion electrically connected to the second electrode and exposed from the sealing resin; a third terminal portion electrically connected to the third electrode and exposed from the sealing resin; a fourth terminal portion electrically connected to the fourth electrode and exposed from the sealing resin; a first island portion on which the first semiconductor element is mounted; and a second island portion on which the second semiconductor element is mounted, wherein when four quadrants divided by a first imaginary line extending along a second direction orthogonal to a first direction as viewed in the first direction and a second imaginary line extending along a third direction orthogonal to both the first direction and the second direction are defined, a region where the first terminal portion is disposed is defined as a first quadrant, a region adjacent to the first quadrant in the second direction is defined as a second quadrant, a region adjacent to the second quadrant in the third direction and diagonal to the first quadrant is defined as a third quadrant, and a region adjacent to the first quadrant in the third direction and adjacent to the third quadrant in the second direction is defined as a fourth quadrant, the second terminal portion is disposed in the second quadrant, the third terminal portion is disposed in the third quadrant, and the fourth terminal portion is disposed in the fourth quadrant.

According to another embodiment of the present disclosure, there is provided a power conversion device. The device includes: the semiconductor device; a capacitor connected at one end to the first terminal portion and at the other end to the fourth terminal portion, and configured to apply a voltage to between the first electrode of the first semiconductor element and the fourth electrode of the second semiconductor element; an inductor connected to a connection point between the second electrode of the first semiconductor element and the third electrode of the second semiconductor element, and configured to smooth an output voltage from the semiconductor device; a drive circuit configured to control switching between an on state and an off state of each of the first semiconductor element and the second semiconductor element; and a circuit board on which at least the semiconductor device, the capacitor, and the inductor are mounted.

BRIEF DESCRIPTION OF DRAWINGS

The accompanying drawings, which are incorporated in and constitute a part of the specification, illustrate embodiments of the present disclosure.

FIG. 3 is a side view (left side view) showing the semiconductor device according to the first embodiment.

DETAILED DESCRIPTION

Figure 1:
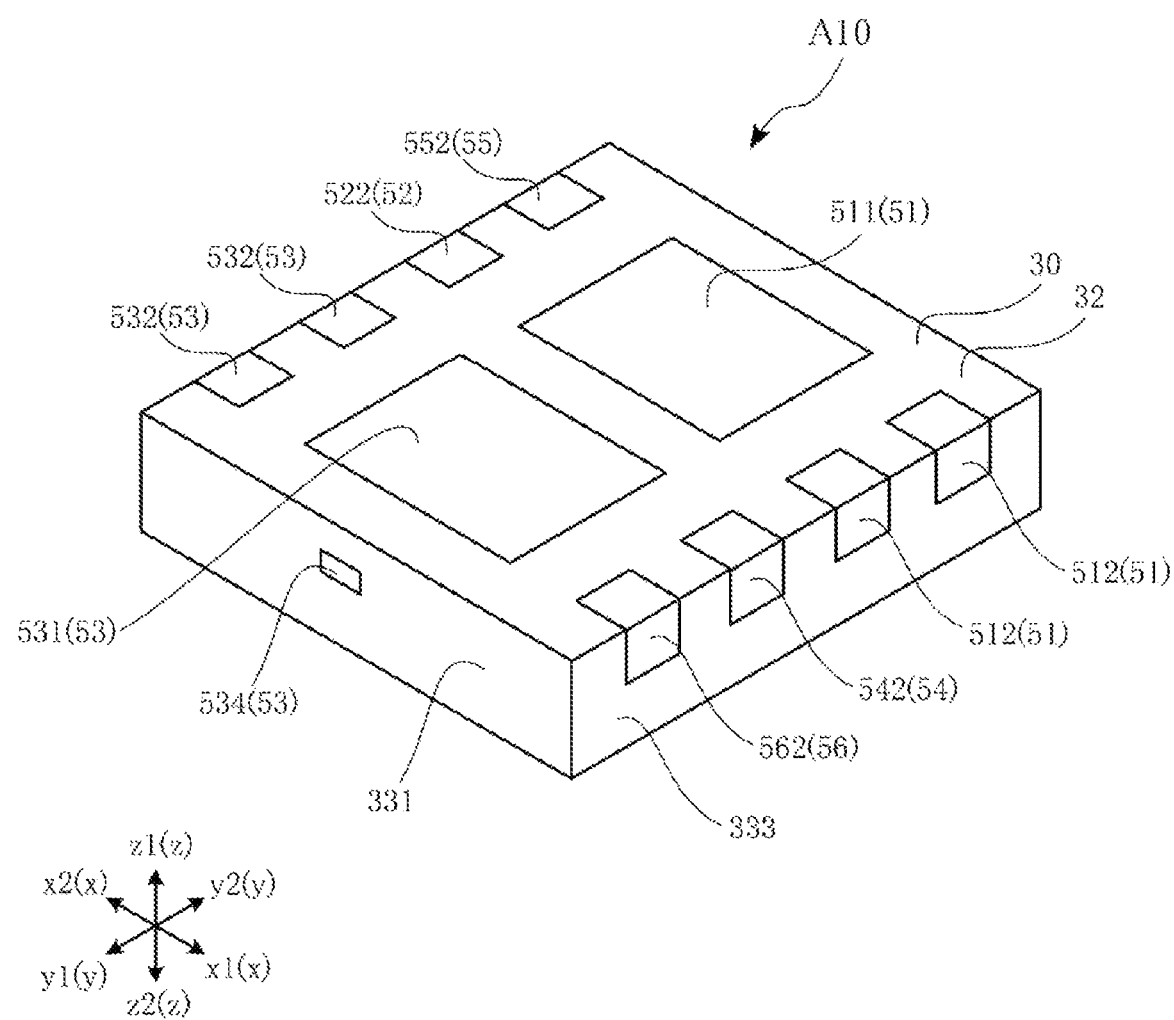
FIG. 1 is a perspective view showing a semiconductor device according to a first embodiment.

Embodiments of a semiconductor device and a power conversion device of the present disclosure will be described below with reference to the drawings.

In the present disclosure, "a certain object A overlapping with a certain object B as viewed in a certain direction" includes "the certain object A overlapping with the entirety of the certain object B as viewed in the certain direction" and "the certain object A overlapping with a part of the certain object B as viewed in the certain direction" unless mentioned otherwise. Furthermore, in the present disclosure, the terms "first," "second," "third," and the like are merely used as labels, and are not necessarily intended to add permutation to those objects.

FIGS. 1 to 6 show a semiconductor device A10 according to a first embodiment of the present disclosure. The semiconductor device A10 includes two semiconductor elements 10 and 20, a sealing resin 30, bonding wires 40, lead frames 50, and conductive bonding materials 61 and 62. The lead frames 50 include first leads 51, a second lead 52, third leads 53, a fourth lead 54, a fifth lead 55, and a sixth lead 56.

Figure 2:
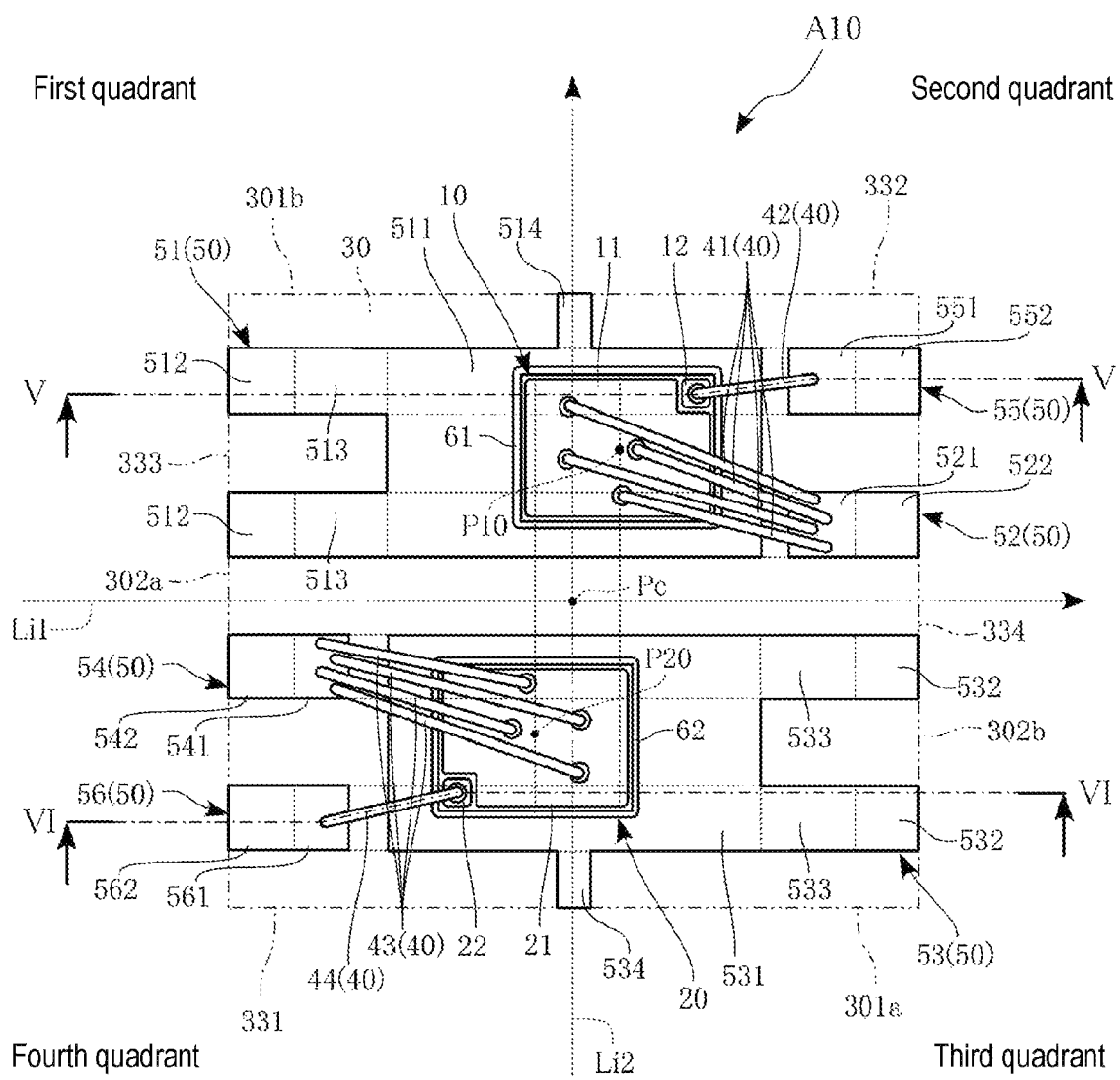
FIG. 2 is a plan view showing the semiconductor device according to the first embodiment, in which a sealing resin is indicated by an imaginary line.
Figure 4:
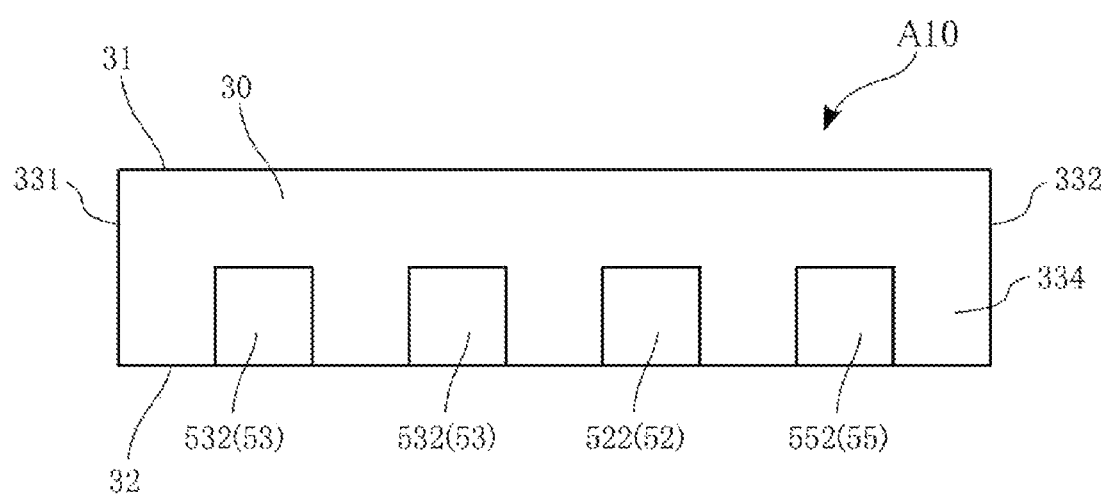
FIG. 4 is a side view (right side view) showing the semiconductor device according to the first embodiment.
Figure 4:
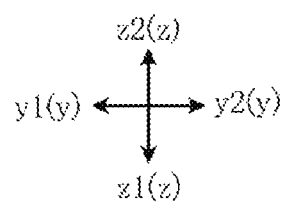
Figure 5:
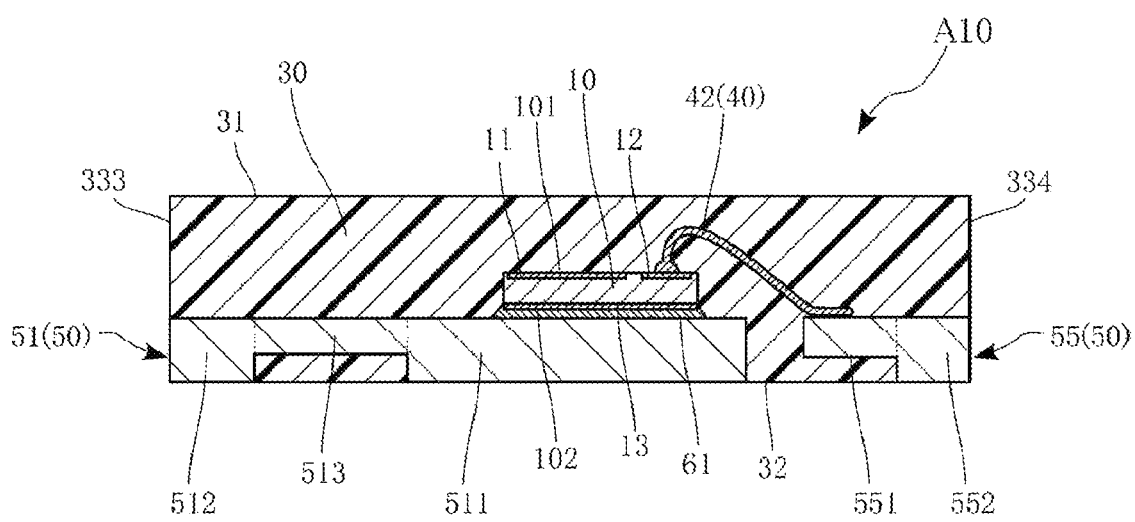
FIG. 5 is a cross-sectional view taken along line V-V in FIG. 2.
Figure 5:
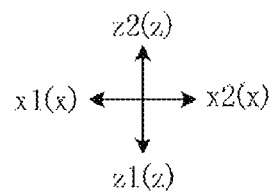
Figure 6:
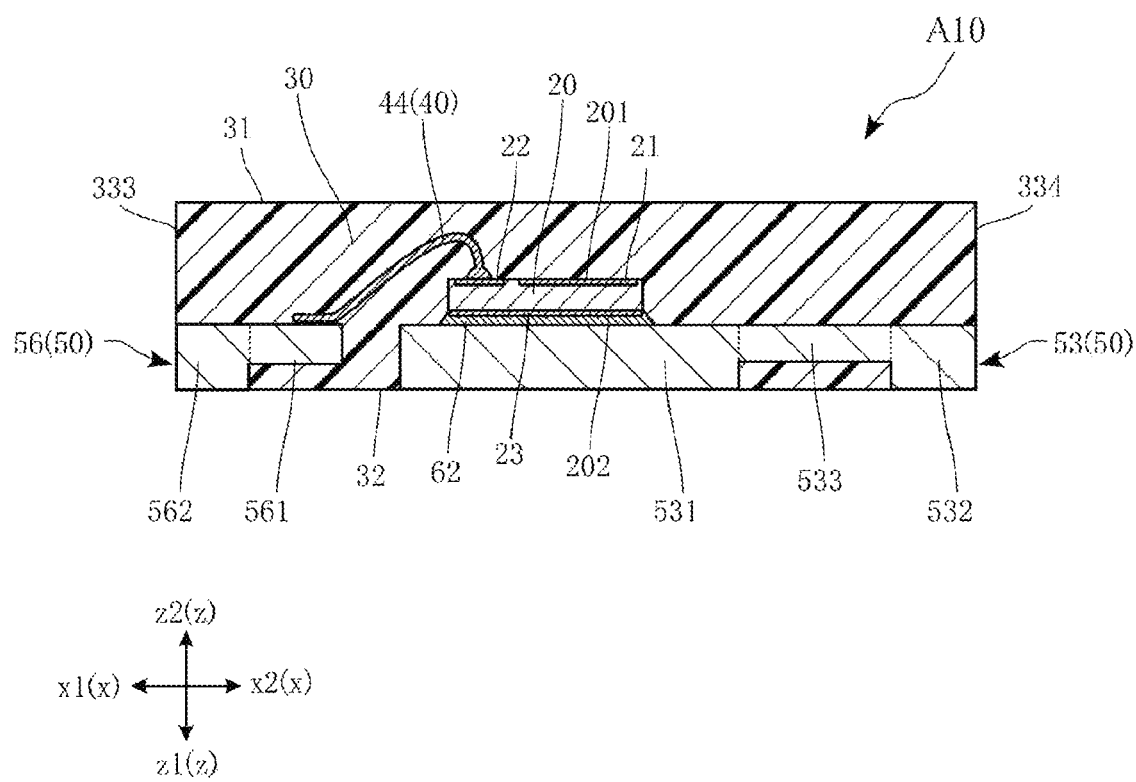
FIG. 6 is a cross-sectional view taken along line VI-VI in FIG. 2.

FIG. 1 is a perspective view of the semiconductor device A10. The perspective view shown in FIG. 1 is a view from the bottom side. FIG. 2 is a plan view of the semiconductor device A10, in which the sealing resin 30 is indicated by an imaginary line (two-dot chain line). FIG. 3 is a side view of the semiconductor device A10 and shows a side surface (left side surface) when the x2 direction is viewed from the x1 direction side. FIG. 4 is a side view of the semiconductor device A10 and shows a side surface (right side surface) when the x1 direction is viewed from the x2 direction side. FIG. 5 is a cross-sectional view taken along line V-V in FIG. 2. FIG. 6 is a cross-sectional view taken along line VI-VI in FIG. 2.

For the sake of convenience of explanation, three directions orthogonal to each other are defined as an x direction, a y direction and a z direction. The z direction is the thickness direction of the semiconductor device A10. The x direction is the left-right direction in a plan view (see FIG. 2) of the semiconductor device A10. They direction is the vertical direction in a plan view (see FIG. 2) of the semiconductor device A10. As necessary, one side of the x direction is defined as an x1 direction and the other side of the x direction is defined as an x2 direction. Similarly, one side of they direction is defined as a y1 direction and the other side of they direction is defined as a y2 direction. One side of the z direction is defined as a z1 direction and the other side of the z direction is defined as a z2 direction. Furthermore, the z1 direction may be referred to as "lower" or "downward" and the z2 direction may be referred to as "upper" or "upward." The x direction corresponds to the "second direction" recited in the claims, the y direction corresponds to the "third direction" recited in the claims, and the z direction corresponds to the "first direction" recited in the claims.

The semiconductor device A10 is surface-mounted on a circuit board of various electronic devices and the like. In the present embodiment, the semiconductor device A10 has a substantially rectangular shape when viewed in the z direction (hereinafter also referred to as "in a plan view"). In the present embodiment, the semiconductor device A10 has a package structure called SON (Small Outline Non-lead).

The semiconductor elements 10 and 20 are elements that exhibit the electrical functions of the semiconductor device A10. In the present embodiment, both the semiconductor elements 10 and 20 are n-type MOSFETs. The semiconductor elements 10 and 20 are not limited to n-type MOSFETs. Either one or both of the semiconductor elements 10 and 20 may be p-type MOSFETs. Furthermore, the semiconductor elements 10 and 20 are not limited to MOSFETs, and may be other switching elements such as field effect transistors including MISFETs (Metal-Insulator-Semiconductor FETs), bipolar transistors, or IGBTs (Insulated Gate Bipolar Transistors). Each constituent material of the semiconductor elements 10 and 20 includes, for example, SiC (silicon carbide), Si (silicon), GaN (gallium nitride), or GaAs (gallium arsenide). In the present embodiment, the semiconductor elements 10 and 20 have a rectangular shape in a plan view. The semiconductor element 10 corresponds to a "first semiconductor element" recited in the claims, and the semiconductor element 20 corresponds to a "second semiconductor element" recited in the claims.

The semiconductor element 10 includes a main surface 101 and a back surface 102. The main surface 101 and the back surface 102 are spaced apart from each other in the z direction and configured to face opposite sides. The main surface 101 faces the z2 direction, and the back surface 102 faces the z1 direction. The main surface 101 corresponds to a "first main surface" recited in the claims, and the back surface 102 corresponds to a "first back surface" recited in the claims.

The semiconductor element 10 is a three-terminal element having three electrodes. In the present embodiment, the semiconductor element 10 includes a source electrode 11, a gate electrode 12, and a drain electrode 13. The source electrode 11 and the gate electrode 12 are exposed to the outside of the semiconductor element 10 on the main surface 101. The position of the gate electrode 12 in a plan view is not limited to that illustrated in FIG. 2. The gate electrode 12 may be disposed at any position on the main surface 101. The area occupied by the gate electrode 12 on the main surface 101 is smaller than the area occupied by the source electrode 11 on the main surface 101. In addition, an occupation proportion of each of the source electrode 11 and the gate electrode 12 on the main surface 101 is not limited to that shown in FIG. 2. The drain electrode 13 is exposed to the outside of the semiconductor element 10 on the back surface 102. Therefore, the semiconductor element 10 is a MOSFET having a vertical structure. The drain electrode 13 corresponds to a "first electrode" recited in the claims, and the source electrode 11 corresponds to a "second electrode" recited in the claims. The gate electrode 12 corresponds to a "fifth electrode" recited in the claims.

The semiconductor element 10 is bonded to the lead frame 50 (specifically, an island portion 511 of the first lead 51 described later) via the conductive bonding material 61.

The semiconductor element 20 has a main surface 201 and a back surface 202. The main surface 201 and the back surface 202 are spaced apart from each other in the z direction and configured to face the opposite sides. The main surface 201 faces the z2 direction, and the back surface 202 faces the z1 direction. The main surface 201 corresponds to a "second main surface" recited in the claims, and the back surface 202 corresponds to a "second back surface" recited in the claims.

Similar to the semiconductor element 10, the semiconductor element 20 is a three-terminal element having three electrodes. In the present embodiment, the semiconductor element 20 includes a source electrode 21, a gate electrode 22, and a drain electrode 23. The source electrode 21 and the gate electrode 22 are exposed to the outside of the semiconductor element 20 on the main surface 201. The position of the gate electrode 22 in a plan view is not limited to that illustrated in FIG. 2. The gate electrode 22 may be disposed at any position on the main surface 201. The area occupied by the gate electrode 22 on the main surface 201 is smaller than the area occupied by the source electrode 21 on the main surface 201. In addition, an occupation proportion of each of the source electrode 21 and the gate electrode 22 on the main surface 201 is not limited to that shown in FIG. 2. The drain electrode 23 is exposed to the outside of the semiconductor element 20 on the back surface 202. Therefore, the semiconductor element 20 is a MOSFET having a vertical structure. The drain electrode 23 corresponds to a "third electrode" recited in the claims, and the source electrode 21 corresponds to a "fourth electrode" recited in the claims. The gate electrode 22 corresponds to a "sixth electrode" recited in the claims.

The semiconductor element 20 is bonded to the lead frame 50 (specifically, an island portion 531 of the third lead 53 described later) via the conductive bonding material 62.

The sealing resin 30 covers a part of the lead frame 50, the semiconductor elements 10 and 20, and the plurality of bonding wires 40. The sealing resin 30 has an insulating property. The constituent material of the sealing resin 30 is, for example, a black epoxy resin. In the present embodiment, the sealing resin 30 has a rectangular shape in a plan view. Further, the shape of the sealing resin 30 in a plan view is not limited thereto.

As shown in FIG. 2, the sealing resin 30 includes a pair of first end edges 301a and 301b and a pair of second end edges 302a and 302b in a plan view. Each of the first end edges 301a and 301b extends along the x direction. The first end edge 301a is an end edge in the y1 direction, and the first end edge 301b is an end edge in the y2 direction. Each of the second end edges 302a and 302b extends along the y direction. The second end edge 302a is an end edge in the x1 direction, and the second end edge 302b is an end edge in the x2 direction.

As shown in FIGS. 1 to 6, the sealing resin 30 includes a resin main surface 31, a resin back surface 32, and a plurality of resin side surfaces 331 to 334. The resin main surface 31 and the resin back surface 32 are spaced apart from each other in the z direction and face the opposite sides. The resin main surface 31 faces the z2 direction, and the resin back surface 32 faces the z1 direction. As shown in FIGS. 1 to 6, each of the resin side surfaces 331 to 334 is a flat surface orthogonal to both the resin main surface 31 and the resin back surface 32. In the present embodiment, the resin side surfaces 331 and 332 are spaced apart from each other in the y direction and face the opposite sides. The resin side surface 331 faces the y1 direction, and the resin side surface 332 faces the y2 direction. The resin side surfaces 333 and 334 are spaced apart from each other in the x direction and face the opposite sides. The resin side surface 333 faces the x1 direction, and the resin side surface 334 faces the x2 direction. In a plan view, the resin side surface 331 corresponds to the first end edge 301a, and the resin side surface 332 corresponds to the first end edge 301b. Furthermore, in a plan view, the resin side surface 333 corresponds to the second end edge 302a, and the resin side surface 334 corresponds to the second end edge 302b.

Each of the bonding wires 40 is a linear member having conductivity. The constituent material of each bonding wire 40 is made of Cu (copper), Au (gold), or Al (aluminum). The bonding wires 40 include a plurality of first wires 41, a second wire 42, a plurality of third wires 43, and a fourth wire 44.

Each of the first wires 41 is joined at one end to the source electrode 11 of the semiconductor element 10 and at the other end to the second lead 52. Therefore, the first wires 41 electrically connect the source electrode 11 and the second lead 52. The number of the first wires 41 is not limited to the illustrated number, and may be singular. Furthermore, instead of the first wires 41, bonding ribbons may be used, or plate-shaped metal members (clips) may be used.

The second wire 42 is joined at one end to the gate electrode 12 of the semiconductor element 10 and at the other end to the fifth lead 55. Therefore, the second wire 42 electrically connects the gate electrode 12 and the fifth lead 55.

Each of the third wires 43 is joined at one end to the source electrode 21 of the semiconductor element 20 and at the other end to the fourth lead 54. Therefore, the third wires 43 electrically connect the source electrode 21 and the fourth lead 54. The number of the third wires 43 is not limited to the illustrated number, and may be singular. Furthermore, instead of the third wires 43, bonding ribbons may be used, or plate-shaped metal members (clips) may be used.

The fourth wire 44 is joined at one end to the gate electrode 22 of the semiconductor element 20 and at the other end to the sixth lead 56. Therefore, the fourth wire 44 electrically connects the gate electrode 22 and the sixth lead 56.

The lead frame 50 is configured to support the two semiconductor elements 10 and 20 and is electrically connected thereto. The lead frame 50 may be formed, for example, by machining a metal plate. The machining is performed, for example, by punching, bending, polishing, etching, laser processing, or the like. In the present embodiment, the lead frame 50 is made of metal, and is made of one of Cu (copper) and Ni (nickel), one of a Cu alloy and a Ni alloy, or a 42 alloy. In the present embodiment, as described above, the lead frame 50 includes the first lead 51, the second lead 52, the third lead 53, the fourth lead 54, the fifth lead 55, and the sixth lead 56. These leads are spaced apart from each other. The shape and size of each of the leads 51 to 56 are not limited to the ones shown in FIGS. 1 to 6.

As shown in FIGS. 2 and 5, the first lead 51 is mounted with the semiconductor element 10 and is electrically connected to the drain electrode 13 of the semiconductor element 10 via the conductive bonding material 61. The first lead 51 includes an island portion 511, two terminal portions 512, two connecting portions 513, and an extension portion 514.

The island portion 511 is a portion where the semiconductor element 10 is mounted. In the present embodiment, as shown in FIG. 2, the island portion 511 has a rectangular shape extending in the x direction in a plan view. The surface of the island portion 511 facing the z1 direction is exposed from the resin back surface 32 of the sealing resin 30. The island portion 511 corresponds to a "first island portion" recited in the claims.

Each of the two terminal portions 512 is a terminal partially exposed from the sealing resin 30 and is used when the semiconductor device A10 is mounted on the circuit board. In the present embodiment, in each terminal portion 512, an end surface facing the x1 direction and a surface facing the z1 direction are exposed from the sealing resin 30. The surface facing the z1 direction is flush with the resin back surface 32. The two terminal portions 512 are spaced apart in the y direction in a plan view. The terminal portion 512 corresponds to a "first terminal portion" recited in the claims.

Each of the two connecting portions 513 is a portion connecting the island portion 511 and the terminal portion 512. Each connecting portion 513 is covered with the sealing resin 30. In each connecting portion 513, the surface facing the z1 direction may be exposed from the resin back surface 32.

The extension portion 514 is a portion extending from the end edge of the island portion 511 in the y2 direction in a plan view. The end surface of the extension portion 514 facing the y2 direction is substantially flush with the resin side surface 332.

In the present embodiment, each terminal portion 512 is connected to the island portion 511 via each connecting portion 513. The island portion 511 is electrically connected to the drain electrode 13 of the semiconductor element 10 through the conductive bonding material 61. Therefore, each terminal portion 512 is electrically connected to the drain electrode 13 of the semiconductor element 10. That is, each terminal portion 512 is a drain terminal of the semiconductor element 10 of the semiconductor device A10.

In the present embodiment, the first lead 51 includes two sets of one terminal portion 512 and one connecting portion 513 connected to each other. The two sets of the terminal portion 512 and the connecting portion 513 are spaced apart from each other, and are arranged in the y direction in the present embodiment.

As shown in FIG. 2, the second lead 52 is electrically connected to the source electrode 11 of the semiconductor element 10 via the first wires 41. The second lead 52 has a rectangular shape in a plan view. The second lead 52 includes a pad portion 521 and a terminal portion 522.

The pad portion 521 is a portion to which the first wires 41 are joined. In the present embodiment, the pad portion 521 is covered with the sealing resin 30.

The terminal portion 522 is a terminal partially exposed from the sealing resin 30 and is used when the semiconductor device A10 is mounted on the circuit board. In the present embodiment, in the terminal portion 522, an end surface facing the x2 direction and a surface facing the z1 direction are exposed from the sealing resin 30. The surface facing the z1 direction is flush with the resin back surface 32. The terminal portion 522 is connected to the pad portion 521. The terminal portion 522 overlaps with one of the two terminal portions 512 and a part of the island portion 511 when viewed in the x direction. The terminal portion 522 corresponds to a "second terminal portion" recited in the claims.

In the present embodiment, the terminal portion 522 is connected to the pad portion 521. The pad portion 521 is electrically connected to the source electrode 11 of the semiconductor element 10 through the first wires 41. Therefore, the terminal portion 522 is electrically connected to the source electrode 11 of the semiconductor element 10. That is, the terminal portion 522 is a source terminal of the semiconductor element 10 of the semiconductor device A10.

As shown in FIGS. 2 and 6, the third lead 53 is mounted with the semiconductor element 20 and is electrically connected to the drain electrode 23 of the semiconductor element 20 via the conductive bonding material 62. The third lead 53 has a rectangular shape in a plan view. The third lead 53 includes an island portion 531, two terminal portions 532, two connecting portions 533, and an extension portion 534.

The island portion 531 is a portion where the semiconductor element 20 is mounted. In the present embodiment, as shown in FIG. 2, the island portion 531 has a rectangular shape extending in the x direction in a plan view. The surface of the island portion 531 facing the z1 direction is exposed from the resin back surface 32 of the sealing resin 30. In the present embodiment, the island portion 531 overlaps with the island portion 511 when viewed in the y direction. The island portion 531 corresponds to a "second island portion" recited in the claims.

Each of the two terminal portions 532 is a terminal partially exposed from the sealing resin 30 and is used when the semiconductor device A10 is mounted on the circuit board. In the present embodiment, in each terminal portion 532, an end surface facing the x2 direction and a surface facing the z1 direction are exposed from the sealing resin 30. The surface facing the z1 direction is flush with the resin back surface 32. The two terminal portions 532 are spaced apart from each other in the y direction in a plan view. The terminal portion 532 corresponds to a "third terminal portion" recited in the claims.

Each of the two connecting portions 533 is a portion connecting the island portion 531 and the terminal portion 532. Each connecting portion 533 is covered with the sealing resin 30. In each connecting portion 533, a surface facing the z1 direction may be exposed from the resin back surface 32.

The extension portion 534 is a portion extending from the end edge of the island portion 531 in the y2 direction in a plan view. The end surface of the extension portion 534 facing the y1 direction is substantially flush with the resin side surface 331. As shown in FIG. 2, the extension portion 534 overlaps with the extension portion 514 of the first lead 51 when viewed in they direction. The arrangement of the extension portion 514 and the extension portion 534 is not limited thereto and they may not overlap.

In the present embodiment, each terminal portion 532 is connected to the island portion 531 via each connecting portion 533. The island portion 531 is electrically connected to the drain electrode 23 of the semiconductor element 20 through the conductive bonding material 62. Accordingly, each terminal portion 532 is electrically connected to the drain electrode 23 of the semiconductor element 20. That is, each terminal portion 532 is a drain terminal of the semiconductor element 20 in the semiconductor device A10.

In the present embodiment, the third lead 53 includes two sets of one terminal portion 532 and one connecting portion 533 connected to each other. The two sets of the terminal portion 532 and the connecting portion 533 are spaced apart from each other and are arranged in the y direction in the present embodiment.

As shown in FIG. 2, the fourth lead 54 is electrically connected to the source electrode 21 of the semiconductor element 20 via the third wires 43. The fourth lead 54 has a rectangular shape in a plan view. The fourth lead 54 includes a pad portion 541 and a terminal portion 542.

The pad portion 541 is a portion to which the third wires 43 are joined. In the present embodiment, the pad portion 541 is covered with the sealing resin 30.

The terminal portion 542 is a terminal partially exposed from the sealing resin 30 and is used when the semiconductor device A10 is mounted on the circuit board. In the present embodiment, in the terminal portion 542, an end surface facing the x1 direction and a surface facing the z1 direction are exposed from the sealing resin 30. The surface facing the z1 direction is flush with the resin back surface 32. The terminal portion 542 is connected to the pad portion 541. The terminal portion 542 overlaps with one of the two terminal portions 532 and a part of the island portion 531 when viewed in the x direction. The terminal portion 542 corresponds to a "fourth terminal portion" recited in the claims.

In the present embodiment, the terminal portion 542 is connected to the pad portion 541. The pad portion 541 is electrically connected to the source electrode 21 of the semiconductor element 20 via the third wires 43. Therefore, the terminal portion 542 is electrically connected to the source electrode 11 of the semiconductor element 20. That is, the terminal portion 542 is a source terminal of the semiconductor element 20 in the semiconductor device A10.

As shown in FIG. 2, the fifth lead 55 is electrically connected to the gate electrode 12 of the semiconductor element 10 via the second wire 42. The fifth lead 55 has a rectangular shape in a plan view. The fifth lead 55 includes a pad portion 551 and a terminal portion 552.

The pad portion 551 is a portion to which the second wire 42 is joined. In the present embodiment, the pad portion 551 is covered with the sealing resin 30.

The terminal portion 552 is a terminal partially exposed from the sealing resin 30 and is used when the semiconductor device A10 is mounted on the circuit board. In the present embodiment, in the terminal portion 552, an end surface facing the x2 direction and a surface facing the z1 direction are exposed from the sealing resin 30. The surface facing the z1 direction is flush with the resin back surface 32. The terminal portion 552 is connected to the pad portion 551. The terminal portion 552 overlaps with one of the two terminal portions 512 (one that does not overlap with the terminal portion 522 as viewed in the x direction) and a part of the island portion 511 when viewed in the x direction. The terminal portion 552 corresponds to a "fifth terminal portion" recited in the claims.

In the present embodiment, the terminal portion 552 is connected to the pad portion 551. The pad portion 551 is electrically connected to the gate electrode 12 of the semiconductor element 10 through the second wire 42. Therefore, the terminal portion 552 is electrically connected to the gate electrode 12 of the semiconductor element 10. That is, the terminal portion 552 is a gate terminal of the semiconductor device A10.

As shown in FIG. 2, the sixth lead 56 is electrically connected to the gate electrode 22 of the semiconductor element 20 through the fourth wire 44. The sixth lead 56 has a rectangular shape in a plan view. The sixth lead 56 includes a pad portion 561 and a terminal portion 562.

The pad portion 561 is a portion to which the fourth wire 44 is joined. In the present embodiment, the pad portion 561 is covered with the sealing resin 30.

The terminal portion 562 is a terminal partially exposed from the sealing resin 30 and is used when the semiconductor device A10 is mounted on the circuit board. In the present embodiment, in the terminal portion 562, an end surface facing the x1 direction and a surface facing the z1 direction are exposed from the sealing resin 30. The surface facing the z1 direction is flush with the resin back surface 32. The terminal portion 562 is connected to the pad portion 561. The terminal portion 562 overlaps with one of the two terminal portions 532 (one that does not overlap with the terminal portion 542 as viewed in the x direction) and a part of the island portion 531 when viewed in the x direction. The terminal portion 562 corresponds to a "sixth terminal portion" recited in the claims.

In the present embodiment, the terminal portion 562 is connected to the pad portion 561. The pad portion 561 is electrically connected to the gate electrode 22 of the semiconductor element 20 through the fourth wire 44. Therefore, the terminal portion 562 is electrically connected to the gate electrode 22 of the semiconductor element 20. That is, the terminal portion 562 is a gate terminal of the semiconductor element 20 in the semiconductor device A10.

The conductive bonding material 61 conductively bonds the semiconductor element 10 to the island portion 511 of the first lead 51. The constituent material of the conductive bonding material 61 is, for example, lead-containing or lead-free solder, or a sintered metal such as sintered silver or sintered copper. The constituent material of the conductive bonding material 61 is not limited thereto as long as it has conductivity.

The conductive bonding material 61 is interposed between the back surface 102 of the semiconductor element 10 and the island portion 511 to electrically connect the drain electrode 13 of the semiconductor element 10 and the island portion 511. Although a fillet is formed in the conductive bonding material 61 shown in FIG. 5, the fillet may not be formed. The conductive bonding material 61 corresponds to a "first conductive bonding material" recited in the claims.

The conductive bonding material 62 conductively bonds the semiconductor element 20 to the island portion 531 of the third lead 53. The constituent material of the conductive bonding material 62 is the same as the constituent material of the conductive bonding material 61.

The conductive bonding material 62 is interposed between the back surface 202 of the semiconductor element 20 and the island portion 531 to electrically connect the drain electrode 23 of the semiconductor element 20 and the island portion 531. Although a fillet is formed in the conductive bonding material 62 shown in FIG. 6, the fillet may not be formed. The conductive bonding material 62 corresponds to a "second conductive bonding material" recited in the claims.

In the present embodiment, as shown in FIG. 2, two imaginary lines Li1 and Li2 are considered in a plan view to define four quadrants divided by the two imaginary lines Li1 and Li2. The imaginary line Li1 extends along the x direction in a plan view. In the present embodiment, the imaginary line Li1 passes through a center of each of the second end edges 302a and 302b in the x direction. The imaginary line Li1 corresponds to a "first imaginary line" recited in the claims. The imaginary line Li2 extends along the y direction in a plan view. In the present embodiment, the imaginary line Li2 passes through a center of each of the first end edges 301a and 301b in the y direction. The imaginary line Li2 corresponds to a "second imaginary line" recited in the claims. An intersection Pc between the two imaginary lines Li1 and Li2 overlaps with an approximate center of the sealing resin 30 in a plan view. The four quadrants described above are a first quadrant, a second quadrant, a third quadrant, and a fourth quadrant. The first quadrant is an area where the terminal portion 512 of the first lead 51 is disposed. The second quadrant is an area located next to the first quadrant in the x direction. The third quadrant is an area located on the diagonal opposite side of the first quadrant and next to the second quadrant in the y direction. The fourth quadrant is an area located next to the first quadrant in the y direction and next to the third quadrant in the x direction. The fourth quadrant is located on the diagonal opposite side of the second quadrant. At this time, the terminal portion 522 of the second lead 52 is disposed in the second quadrant, each terminal portion 532 of the third lead 53 is disposed in the third quadrant, and the terminal portion 542 of the fourth lead 54 is disposed in the fourth quadrant. Furthermore, the terminal portion 552 of the fifth lead 55 is disposed in the second quadrant, and the terminal portion 562 of the sixth lead 56 is disposed in the fourth quadrant.

The two terminal portions 512 are located on the opposite side the terminal portion 522 and the terminal portion 552 in the x direction across the imaginary line Li2. The terminal portion 522 and the terminal portion 552 are located on the opposite side of the two terminal portions 532 in they direction across the imaginary line Li1. The two terminal portions 532 are located on the opposite side of the terminal portion 542 and the terminal portion 562 in the x direction across the imaginary line Li2. The terminal portion 542 and the terminal portion 562 are located on the opposite side of the two terminal portions 512 in they direction across the imaginary line Li1. Therefore, if it is assumed that the area where the two terminal portions 512 are located is the first quadrant, the terminal portion 522 and the terminal portion 552 are located in the second quadrant as described above. Since the terminal portion 522 and the terminal portion 552 are located in the second quadrant, the two terminal portions 532 are located in the third quadrant. Since the two terminal portions 532 are located in the third quadrant, the terminal portion 542 and the terminal portion 562 are located in the fourth quadrant.

As shown in FIG. 2, each terminal portion 512, the terminal portion 542, and the terminal portion 562 are arranged along the second end edge 302a. Each terminal portion 512, the terminal portion 542, and the terminal portion 562 are exposed from the resin side surface 333. These are exposed at the second end edge 302a. In the present embodiment, in each terminal portion 512, the terminal portion 542, and the terminal portion 562, an end surface facing the x1 direction is exposed from the resin side surface 333 and is flush with the resin side surface 333. Further, each terminal portion 512, the terminal portion 542, and the terminal portion 562 protrude in the x1 direction from the resin side surface 333 in a plan view.

As shown in FIG. 2, each terminal portion 512, the terminal portion 542, and the terminal portion 562 overlap with each other when viewed in they direction. Each terminal portion 512, the terminal portion 542, and the terminal portion 562 are arranged in this order from the y2 direction side toward the y1 direction side. Therefore, the two terminal portions 512 and the terminal portion 562 are arranged on the opposite sides in the y direction with the terminal portion 542 interposed therebetween, and the terminal portion 542 is arranged between the two terminal portions 512 and the terminal portion 562 in the y direction.

As shown in FIG. 2, each terminal portion 532, the terminal portion 522, and the terminal portion 552 are arranged along the second end edge 302b. Each terminal portion 532, the terminal portion 522, and the terminal portion 552 are exposed from the resin side surface 334. These are exposed at the second end edge 302b. In the present embodiment, in each terminal portion 532, the terminal portion 522, and the terminal portion 552, an end surface facing the x2 direction is exposed from the resin side surface 334 and is flush with the resin side surface 333. Further, each terminal portion 532, the terminal portion 522, and the terminal portion 552 protrude in the x2 direction from the resin side surface 334 in a plan view.

As shown in FIG. 2, each terminal portion 532, the terminal portion 522, and the terminal portion 552 overlap with each other when viewed in the y direction. Each terminal portion 532, the terminal portion 522, and the terminal portion 552 are arranged in this order from the y1 direction side toward the y2 direction side. Therefore, the two terminal portions 532 and the terminal portion 552 are disposed on the opposite sides in the y direction with the terminal portion 522 interposed therebetween, and the terminal portion 522 is arranged between the two terminal portions 532 and the terminal portion 552 in the y direction.

As shown in FIG. 2, the island portion 511 is disposed between the terminal portion 512 and the terminal portion 522 when viewed in the y direction. In addition, the island portion 511 is disposed between the terminal portion 512 and the terminal portion 552 when viewed in the y direction. The island portion 531 is disposed between the terminal portion 532 and the terminal portion 542 when viewed in the y direction. In addition, the island portion 531 is disposed between the terminal portion 532 and the terminal portion 562 when viewed in the y direction.

As shown in FIG. 2, the semiconductor element 10 is disposed across the first quadrant and the second quadrant, and a center point P10 of the semiconductor element 10 is located in the second quadrant. The center point P10 is an intersection of two diagonal lines of the semiconductor element 10 in a plan view. The semiconductor element 20 is disposed across the third quadrant and the fourth quadrant, and a center point P20 of the semiconductor element 20 is located in the fourth quadrant. The center point P20 is an intersection of two diagonal lines of the semiconductor element 20 in a plan view. Therefore, in a plan view, the center point P10 of the semiconductor element 10 and the center point P20 of the semiconductor element 20 are spaced apart from each other when viewed in the x direction and spaced apart from each other when viewed in the y direction.

Next, a power conversion device B1 provided with the semiconductor device A10 will be described.

Figure 7:
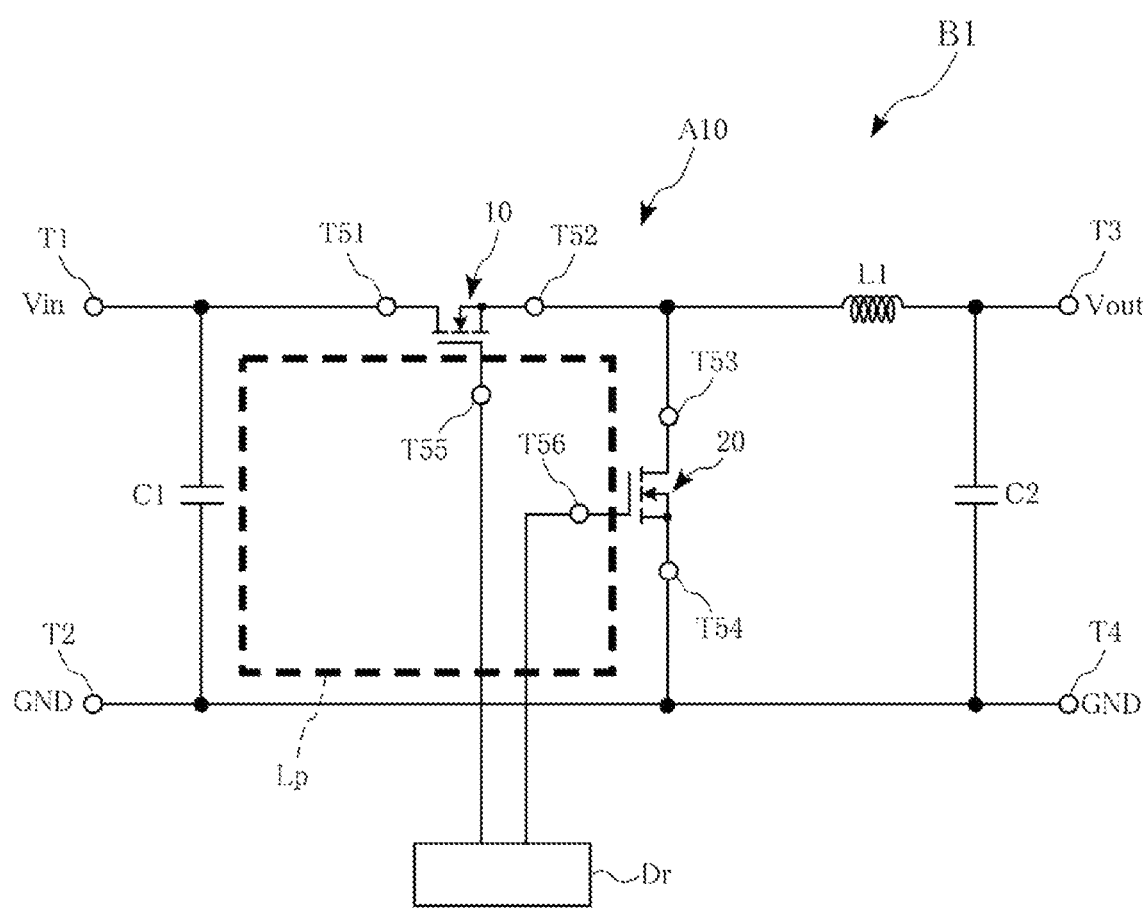
FIG. 7 is a circuit configuration diagram of a power conversion device according to a first embodiment.

FIG. 7 is a circuit configuration diagram of a power conversion device B1 including the semiconductor device A10. The power conversion device B1 shown in FIG. 7 is a synchronous rectification step-down converter. Further, the power conversion device B1 may have any of a circuit configuration that performs constant current control, a circuit configuration that performs constant voltage control, or a circuit configuration that performs constant power control. As shown in FIG. 7, the power conversion device B1 includes a plurality of terminals T1 to T4 and T51 to T56, a semiconductor device A10, capacitors C1 and C2, an inductor L1, and a drive circuit Dr.

The terminals T1 and T2 are input terminals of the power conversion device B1. The terminal T1 is connected to a connection line on the high potential side of a DC power source (not shown). An input voltage Vin is supplied to the terminal T1. The terminal T2 is connected to a connection line on the low potential side of the DC power source (not shown). The terminal T2 is grounded to a reference potential GND.

The terminals T3 and T4 are output terminals of the power conversion device B1. The terminal T3 outputs an output voltage Vout. The terminal T4 is grounded to the reference potential GND.

The terminals TM to T56 correspond to terminals of the semiconductor device A10. The terminal T51 is the drain terminal of the semiconductor element 10 and corresponds to the terminal portion 512 described above. The terminal T52 is a source terminal of the semiconductor element 10 and corresponds to the terminal portion 522 described above. The terminal T53 is a drain terminal of the semiconductor element 20 and corresponds to the terminal portion 532 described above. The terminal T54 is a source terminal of the semiconductor element 20 and corresponds to the terminal portion 542 described above. The terminal T55 is a gate terminal of the semiconductor element 10 and corresponds to the terminal portion 552 described above. The terminal T56 is a gate terminal of the semiconductor element 20 and corresponds to the terminal portion 562 described above.

In the semiconductor device A10, the semiconductor element 10 and the semiconductor element 20 are connected so that the semiconductor element 10 serves as an upper arm and the semiconductor element 20 serves as a lower arm. Specifically, the drain (terminal T51) of the semiconductor element 10 is connected to the terminal T1 to which the input voltage Vin is supplied. The source (terminal T52) of the semiconductor element 10 is connected to the drain (terminal T53) of the semiconductor element 20. The source (terminal T54) of the semiconductor element 20 is connected to the terminals T2 and T4.

The capacitor C1 is connected at one end to the terminal T1 and at the other end to the terminal T2. The capacitor C1 is a filter for removing a noise component included in the input voltage Vin and is configured to stabilize the supply of the input voltage Vin. The capacitor C1 corresponds to a "capacitor" recited in the claims.

The inductor L1 is connected at one end to a connection point between the source (terminal T52) of the semiconductor element 10 and the drain (terminal T53) of the semiconductor element 20, and is connected at the other end to the terminal T3. The capacitor C2 is connected at one end to the other end of the inductor L1 and the terminal T3, and is connected at the other end to the source of the semiconductor element 20 and the terminal T4. The inductor L1 and the capacitor C2 are filters that smooth the output voltage of the semiconductor device A10. An output voltage Vout is generated by the inductor L1 and the capacitor C2. The dimension of the inductor L1 in the z direction is larger than the dimension of the semiconductor device A10 in the z direction.

The drive circuit Dr controls switching between an on state and an off state of each of the semiconductor elements 10 and 20. The drive circuit Dr is connected to the respective gates (terminals T55 and T56) of the semiconductor elements 10 and 20. The drive circuit Dr supplies a drive signal to the respective gates (terminals T55 and T56) of the semiconductor elements 10 and 20, thereby switching the semiconductor element 10 and the semiconductor element 20 between an on state and an off state in a complementary manner. The term "complementary" refers to not only a case where the on/off states of the semiconductor element 10 and the semiconductor element 20 are completely reversed but also a case where there is provided a dead time at which both the semiconductor element 10 and the semiconductor element 20 are kept in an off state.

The power conversion device B1 reduces the input voltage Vin and generates the output voltage Vout by switching the on state and the off state of the semiconductor elements 10 and 20 in a complementary manner through the use of the drive circuit Dr.

Figure 8:
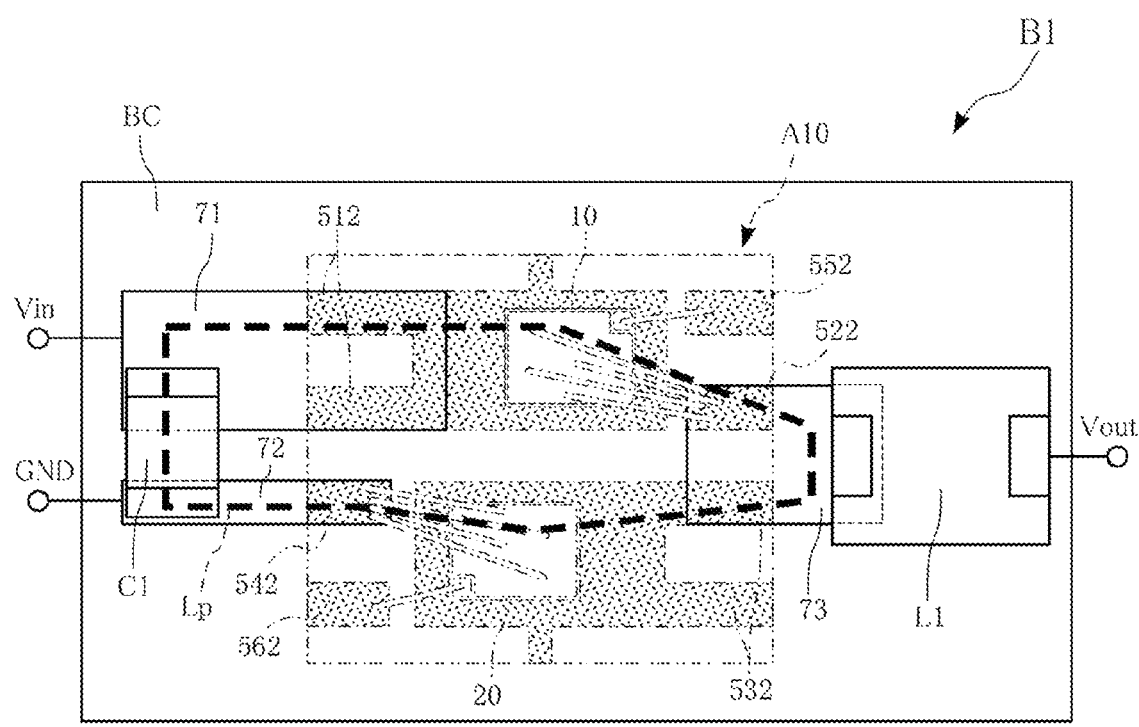
FIG. 8 is a layout diagram of a circuit board of the power conversion device according to the first embodiment.

FIG. 8 is a layout diagram of the circuit board of the power conversion device B1, and shows a component layout and a wiring layout. FIG. 8 is a schematic diagram and does not show all electronic components and wiring patterns. In FIG. 8, the semiconductor device A10 is indicated by an imaginary line (two-dot chain line), and the lead frame 50 is hatched.

Each electronic component of the power conversion device B1 is mounted on a circuit board BC. The structure of the circuit board BC may be any of a single-sided board having one layer, a double-sided board having two layers, and a multilayer board having three or more layers. A first wiring pattern 71, a second wiring pattern 72, and a third wiring pattern 73 are formed on the circuit board BC. Each of the wiring patterns 71 to 73 corresponds to the wiring in the circuit configuration diagram shown in FIG. 8.

The first wiring pattern 71 electrically connects each terminal portion 512 (drain terminal) of the semiconductor element 10 and one end of the capacitor C1. The first wiring pattern 71 is supplied with the input voltage Vin.

The second wiring pattern 72 electrically connects the terminal portion 542 (source terminal) of the semiconductor element 20 and the other end of the capacitor C1. The second wiring pattern 72 is grounded to the reference potential GND.

The third wiring pattern 73 electrically connects the terminal portion 522 (source terminal) of the semiconductor element 10, the terminal portion 532 (drain terminal) of the semiconductor element 20, and one end of the inductor L1. The third wiring pattern 73 is applied with a pulsed switching voltage generated by switching the semiconductor element 10 and the semiconductor element 20 (between the on state and the off state).

The capacitor C1 is disposed closer to the x1 direction side than the semiconductor device A10. Therefore, the capacitor C1 is disposed on the side where the two terminal portions 512 and the terminal portion 552 are disposed in the semiconductor device A10 in a plan view.

The inductor L1 is disposed closer to the x2 direction side than the semiconductor device A10. Therefore, the inductor L1 is disposed on the side where the terminal portion 522 and the two terminal portions 532 are disposed in the semiconductor device A10 in a plan view.

Next, the operations and effects of the semiconductor device A10 and the power conversion device B1 according to the first embodiment will be described.

According to the semiconductor device A10, the terminal portion 512 is disposed in the first quadrant, the terminal portion 522 is disposed in the second quadrant, the terminal portion 532 is disposed in the third quadrant, and the terminal portion 542 is disposed in the fourth quadrant. That is, the terminal portion 512 and the terminal portion 522 are arranged side by side in the x direction, the terminal portion 522 and the terminal portion 532 are arranged side by side in the y direction, the terminal portion 532 and the terminal portion 542 are arranged side by side in the x direction, and the terminal portion 542 and the terminal portion 512 are arranged in a line in the y direction. Therefore, the terminal portion 512 and the terminal portion 542 may be arranged next to each other in the y direction, and the terminal portion 532 and the terminal portion 522 may be arranged next to each other in the y direction. For example, when the semiconductor elements 10 and 20 are switched between the on state and the off state, a high-frequency current flows through a loop Lp indicated by a thick broken line in FIGS. 7 and 8. The loop Lp is an annular path passing through the capacitor C1, the semiconductor element 10, and the semiconductor element 20. The high-frequency current flowing through the loop Lp changes intensely and steeply when the semiconductor elements 10 and 20 are switched between the on state and the off state. This high-frequency ringing generates conduction noise flowing on a power supply line (such as a wiring connecting the terminal T1 and the terminal T3 and a wiring connecting the terminal T2 and the terminal T4) and radiation noise such as a disturbing electromagnetic wave or the like, and is a cause of an adverse effect on the semiconductor device A10 and other electronic components disposed around the semiconductor device A10. For example, the conduction noise is a cause of switching noise superimposed on the input voltage Vin, and the radiation noise is a cause of crosstalk or the like. This ringing becomes more prominent as a parasitic inductance of the wiring in the loop Lp increases. Therefore, according to the semiconductor device A10, the first wiring pattern 71 may be linearly formed on the shortest path between the terminal portion 512 and one end of the capacitor C1, the second wiring pattern 72 may be linearly formed on the shortest path between the other end of the capacitor C1 and the terminal portion 542, and the third wiring pattern 73 may be linearly formed on the shortest path between the terminal portion 522, the terminal portion 532, and the inductor L1. Thus, distances between the first wiring pattern 71, the second wiring pattern 72, and the third wiring pattern 73 can be shortened to thereby reduce a parasitic inductance in each of the wiring patterns 71 to 73. Therefore, the semiconductor device A10 suppresses the noise components (the aforementioned conduction noise and radiation noise) in the power conversion device B1.

According to the semiconductor device A10, the semiconductor element 10 is disposed across the first quadrant and the second quadrant, and the center point P10 thereof is located in the second quadrant. Therefore, the semiconductor element 10 is mounted closer to the x2 direction in the island portion 511 in a plan view. In a plan view, the pad portion 521 and the pad portion 551 are disposed outside the island portion 511 in the x2 direction. According to this configuration, it is possible to reduce a separation distance in a plan view between the source electrode 11 and the pad portion 521 of the semiconductor element 10. Therefore, each of the first wires 41 can be shortened. Furthermore, it is possible to reduce a separation distance in a plan view between the gate electrode 12 and the pad portion 551 of the semiconductor element 10. Therefore, the second wire 42 can be shortened.

According to the semiconductor device A10, the semiconductor element 20 is disposed across the third quadrant and the fourth quadrant, and the center point P20 thereof is located in the fourth quadrant. Therefore, the semiconductor element 20 is mounted closer to the x1 direction in the island portion 531 in a plan view. In a plan view, the pad portion 541 and the pad portion 561 are disposed outside the island portion 531 in the x1 direction. According to this configuration, it is possible to reduce a separation distance in a plan view between the source electrode 21 and the pad portion 541 of the semiconductor element 20. Therefore, each of the third wires 43 can be shortened. Furthermore, it is possible to reduce a separation distance between the gate electrode 22 of the semiconductor element 20 and the pad portion 561 in a plan view. Therefore, the fourth wire 44 can be shortened.

According to the semiconductor device A10, the surface of the island portion 511 facing the z1 direction is exposed from the resin back surface 32 of the sealing resin 30. According to this configuration, heat generated from the semiconductor element 10 when the semiconductor device A10 is supplied with electric power can be dissipated to the outside via the island portion 511. Therefore, it is possible to improve heat dissipation of the semiconductor device A10. Furthermore, if necessary, the island portion 511 may also be utilized as a back surface terminal.

According to the semiconductor device A10, the surface of the island portion 531 facing the z1 direction is exposed from the resin back surface 32 of the sealing resin 30. According to this configuration, heat generated from the semiconductor element 20 when the semiconductor device A10 is supplied with electric power can be dissipated to the outside via the island portion 531. Therefore, it is possible to improve heat dissipation of the semiconductor device A10. Furthermore, if necessary, the island portion 531 may also be utilized as a back surface terminal.

According to the semiconductor device A10, the terminal portion 512, the terminal portion 542, and the terminal portion 562 are arranged in this order in the y direction. In the layout diagram shown in FIG. 8, the terminal portion 562 is arranged outside the loop Lp. In a semiconductor device different from the semiconductor device A10 of the present disclosure, in which the terminal portion 562 is disposed between the terminal portion 512 and the terminal portion 542 in the y direction, the first wiring pattern 71 and the second wiring pattern 72 for connecting the terminal portion 512 and the terminal portion 542 may be formed so as to go around the terminal portion 562 and the gate wiring (not shown) (the wiring pattern on the circuit board BC) connected to the terminal portion 562 when viewed in the z direction. As a result, the distance between the first wiring pattern 71 and the second wiring pattern 72 increases. On the other hand, in the semiconductor device A10, the terminal portion 562 is disposed outside the loop Lp. Therefore, the first wiring pattern 71 and the second wiring pattern 72 are not formed so as to go around the terminal portion 562. Accordingly, the distance between the first wiring pattern 71 and the second wiring pattern 72 can be shortened in the semiconductor device A10. It is therefore possible to reduce the parasitic inductance of the first wiring pattern 71 and the second wiring pattern 72.

According to the semiconductor device A10, the terminal portion 532, the terminal portion 522, and the terminal portion 552 are arranged in this order in the y direction. In the layout diagram shown in FIG. 8, the terminal portion 552 is arranged outside the loop Lp. In a semiconductor device different from the semiconductor device A10 of the present disclosure, in which the terminal portion 552 is disposed between the terminal portion 532 and the terminal portion 522 in the y direction, the third wiring pattern 73 for connecting the terminal portion 532 and the terminal portion 522 may be formed so as to go around the terminal portion 552 and the gate wiring (not shown) (the wiring pattern on the circuit board BC) connected to the terminal portion 552 when viewed in the z direction. As a result, a distance of the third wiring pattern 73 increases. On the other hand, in the semiconductor device A10, the terminal portion 552 is disposed outside the loop Lp. Therefore, the third wiring pattern 73 is not formed so as to go around the terminal portion 562 in a plan view. Accordingly, the distance of the third wiring pattern 73 can be shortened in the semiconductor device A10. It is therefore possible to reduce the parasitic inductance of the third wiring pattern 73.

A modification example of the semiconductor device A10 according to the first embodiment and a semiconductor device according to another embodiment of the present disclosure will be described below. In the following description, components that are the same as or similar to the components already described are denoted by like reference numerals, and the descriptions thereof are omitted.

First Modification of the First Embodiment

Figure 9:
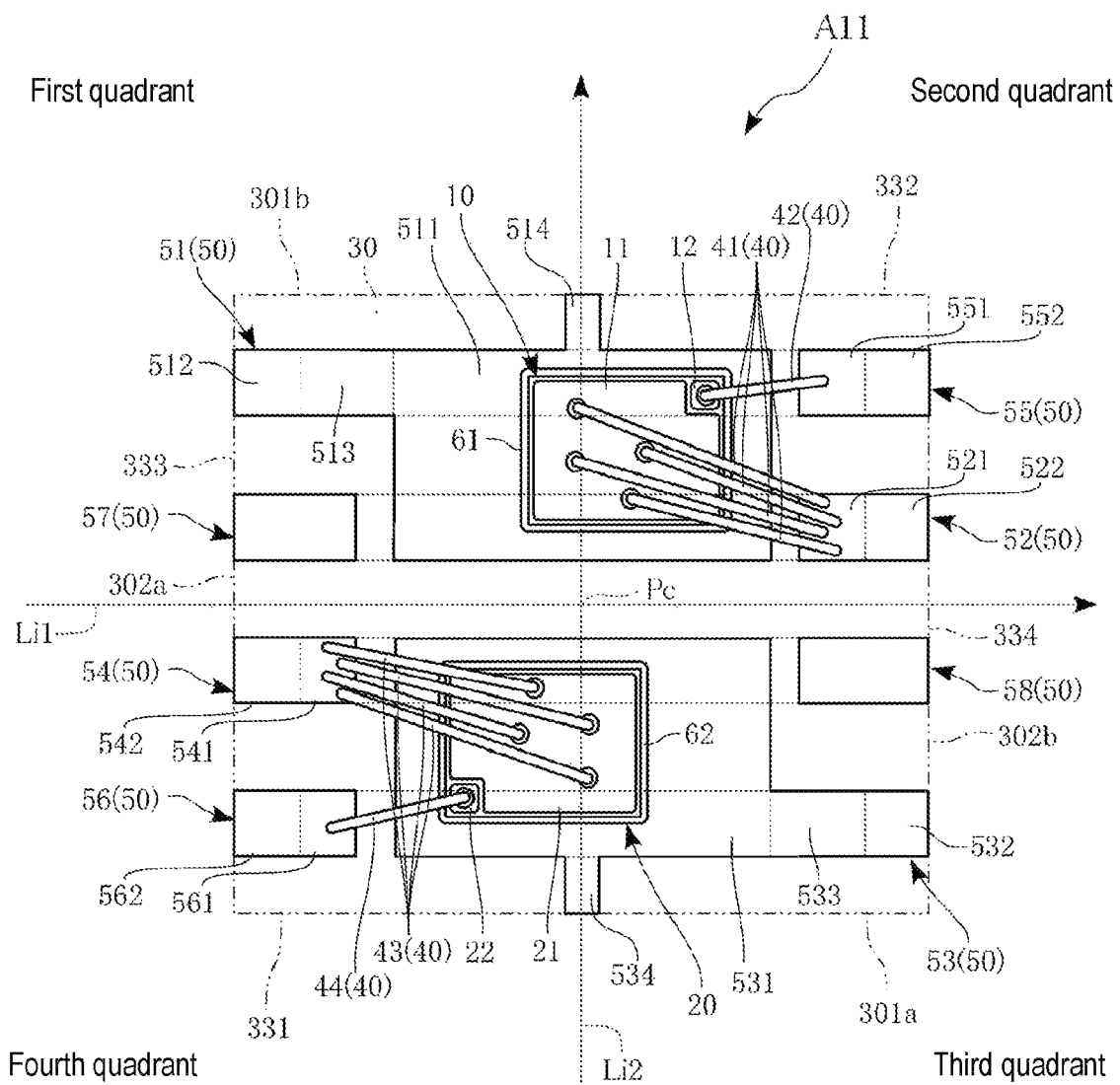
FIG. 9 is a plan view showing a semiconductor device according to a first modification of the first embodiment.
Figure 9:
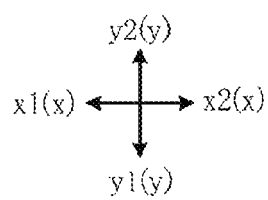

FIG. 9 shows a semiconductor device A11 according to a first modification of the semiconductor device A10. FIG. 9 is a plan view showing the semiconductor device A11, in which the sealing resin 30 is indicated by an imaginary line. The semiconductor device A11 differs from the semiconductor device A10 in that the lead frame 50 further includes a seventh lead 57 and an eighth lead 58.

The seventh lead 57 is formed in place of the set of the terminal portions 512 and the connecting portions 513 of the first lead 51. Therefore, the first lead 51 is configured to include one set of the terminal portions 512 and the connecting portions 513 connected to each other. The seventh lead 57 is spaced apart from the other leads 51 to 56 and 58. The seventh lead 57 is partially exposed from the sealing resin 30 and is a terminal of the semiconductor device A11. However, the seventh lead 57 is not electrically connected to any of the semiconductor elements 10 and 20. Therefore, the seventh lead 57 is a dummy terminal of the semiconductor device A11. In the present embodiment, an end surface of the seventh lead 57 facing the x1 direction is flush with the resin side surface 333, and a surface of the seventh lead 57 facing the z1 direction is flush with the resin back surface 32. Alternatively, the end surface of the seventh lead 57 facing the x1 direction may not be flush with the resin side surface 333 but may protrude from the resin side surface 333 in the x1 direction. In the present embodiment, as shown in FIG. 9, the seventh lead 57 is disposed between the set of the terminal portions 512 and the connecting portions 513 of the first lead 51 and the fourth lead 54 in the y direction. The seventh lead 57 overlaps with the second lead 52 when viewed in the x direction.

The eighth lead 58 is formed in place of the set of the terminal portions 532 and the connecting portions 533 of the third lead 53. Thus, the third lead 53 is configured to include one set of the terminal portions 532 and the connecting portions 533 connected to each other. The eighth lead 58 is spaced apart from the other leads 51 to 57. The eighth lead 58 is partially exposed from the sealing resin 30 and is a terminal of the semiconductor device A11. However, the eighth lead 58 is not electrically connected to any of the semiconductor elements 10 and 20. Therefore, the eighth lead 58 is a dummy terminal of the semiconductor device A11. In the present embodiment, the end surface of the eighth lead 58 facing the x2 direction is flush with the resin side surface 334, and the surface of the eighth lead 58 facing the z1 direction is flush with the resin back surface 32. Alternatively, the end surface of the eighth lead 58 facing the x2 direction may not be flush with the resin side surface 334 but may protrude from the resin side surface 334. In the present embodiment, as shown in FIG. 9, the eighth lead 58 is disposed between the set of the terminal portions 532 and the connecting portions 533 of the third lead 53 and the second lead 52 in they direction. The eighth lead 58 overlaps with the fourth lead 54 when viewed in the x direction.

According to the semiconductor device A11, as in the semiconductor device A10, it is possible to reduce the parasitic inductance in the loop Lp. Therefore, as with the semiconductor device A10, the semiconductor device A11 can suppress the noise components (the aforementioned conduction noise and radiation noise) in the power conversion device B1.

According to the semiconductor device A11, it is possible to increase a distance in the y direction between the terminal portion 512 electrically connected to the drain electrode 13 of the semiconductor element 10 and the terminal portion 542 electrically connected to the source electrode 11 of the semiconductor element 20. Thus, the semiconductor device A11 can suppress an unintended short circuit between the terminal portion 512 and the terminal portion 542.

The semiconductor device A11 includes the seventh lead 57 and the eighth lead 58. According to this configuration, as in the semiconductor device A10, a plurality of terminals is exposed from the sealing resin 30. Thus, the semiconductor device A11 may have the same appearance as the semiconductor device A10.

In the first modification of the first embodiment, there is shown the case where the seventh lead 57 and the eighth lead 58 not electrically connected to any of the semiconductor elements 10 and 20 are provided as dummy terminals. However, the present disclosure is not limited thereto. For example, one or both of the seventh lead 57 and the eighth lead 58 may not be provided.

Second Modification of the First Embodiment

Figure 10:
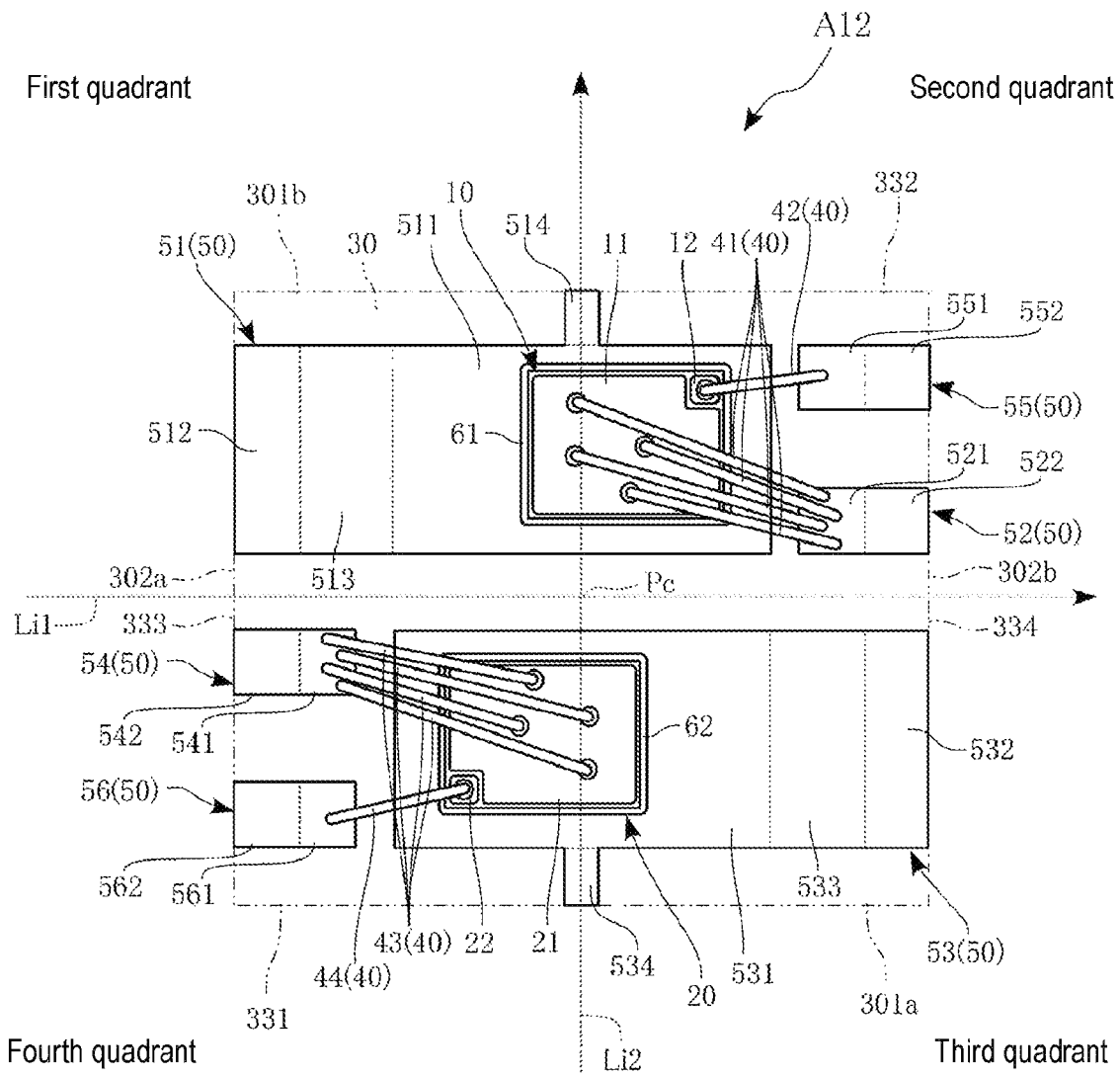
FIG. 10 is a plan view showing a semiconductor device according to a second modification of the first embodiment.
Figure 11:
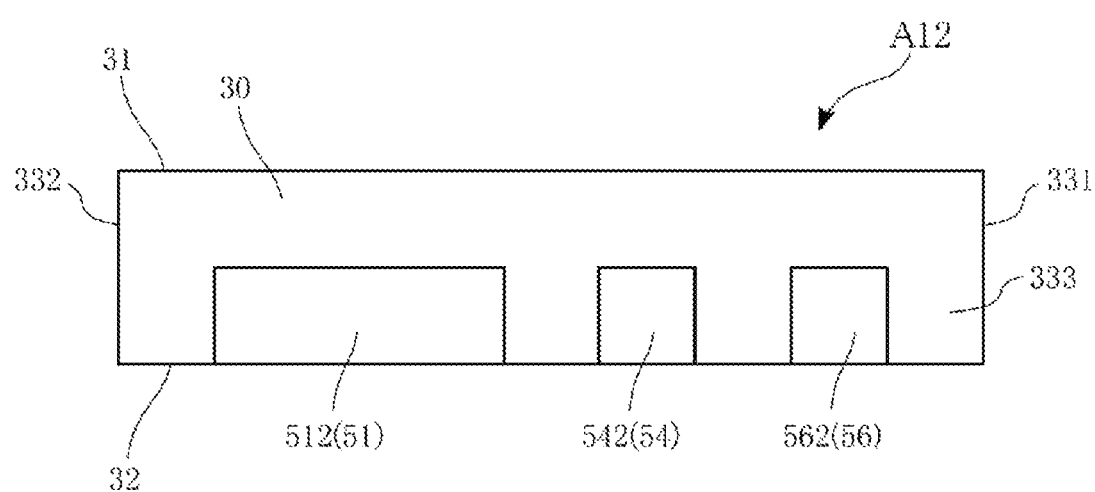
FIG. 11 is a side view (left side view) showing a semiconductor device according to a second modification of the first embodiment.
Figure 11:
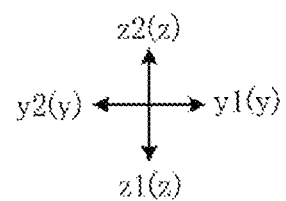

FIGS. 10 and 11 show a semiconductor device A12 according to a second modification of the semiconductor device A10. FIG. 10 is a plan view showing the semiconductor device A12, and shows the sealing resin 30 indicated by an imaginary line. FIG. 11 is a side view showing the semiconductor device A12 and shows a side surface (left side surface) when viewed from the x1 direction side to the x2 direction side. The semiconductor device A12 differs from the semiconductor device A10 in terms of the configurations of the first lead 51 and the second lead 52.

The first lead 51 of the semiconductor device A10 includes two terminal portions 512 and two connecting portions 513. However, the first lead 51 of the semiconductor device A12 according to this modification includes one terminal portion 512 and one connecting portion 513. In addition, both the terminal portion 512 and the connecting portion 513 of this modification have a dimension in the y direction that is substantially equal to the dimension of the island portion 511 in they direction. Accordingly, the first lead 51 in this modification has a rectangular shape extending in the x direction except for an extension portion 514.

The third lead 53 of the semiconductor device A10 includes two terminal portions 532 and two connecting portions 533. However, the third lead 53 of this modification includes one terminal portion 532 and one connecting portion 533. In addition, both the terminal portion 532 and the connecting portion 533 of this modification have a dimension in the y direction that is substantially equal to the dimension of the island portion 531 in the y direction. Accordingly, the third lead 53 according to this modification has a rectangular shape extending in the x direction except for an extension portion 534.

According to the semiconductor device A12, as in the semiconductor device A10, it is possible to reduce the parasitic inductance in the loop Lp. Therefore, as with the semiconductor device A10, the semiconductor device A12 suppresses the noise components (the aforementioned conduction noise and radiation noise) in the power conversion device B1.

According to the semiconductor device A12, the first lead 51 is a single flat plate having a rectangular plan-view shape from the island portion 511 to the terminal portion 512. According to this configuration, a flow path of the current in the first lead 51 can be made larger than that in the first lead 51 of the semiconductor device A10. That is, according to the semiconductor device A12, the wiring resistance from the terminal portion 512 in the first lead 51 to the drain electrode 13 of the semiconductor element 10 can be made smaller than that in the semiconductor device A10. The same applies to the third lead 53. That is, the third lead 53 is a single flat plate having a rectangular plan-view shape from the island portion 531 to the terminal portion 532. According to this configuration, the flow path of the current in the third lead 53 can be made larger than that in the third lead 53 of the semiconductor device A10. That is, according to the semiconductor device A12, the wiring resistance from the terminal portion 532 in the third lead 53 to the drain electrode 23 of the semiconductor element 20 can be made smaller than that in the semiconductor device A10.

Third Modification of the First Embodiment

Figure 12:
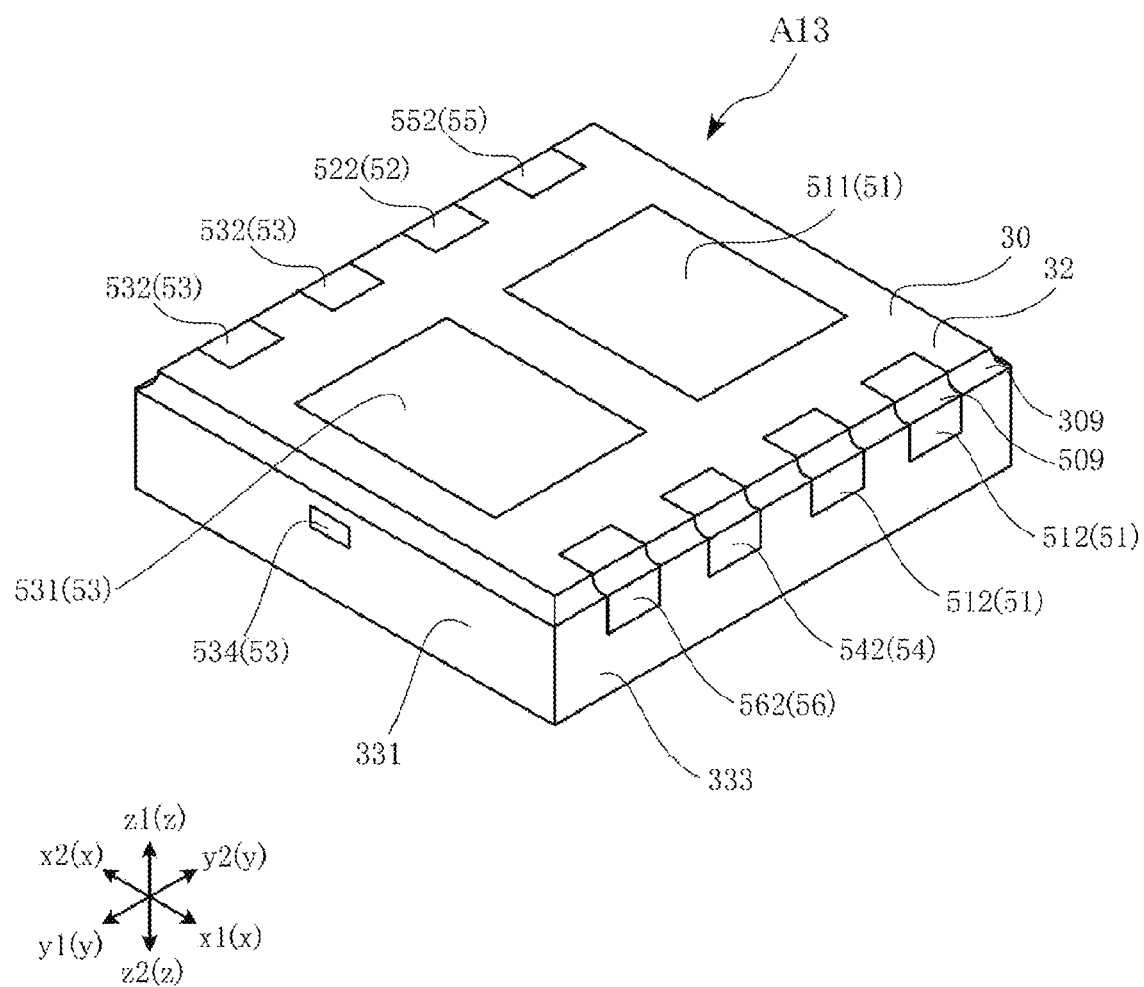
FIG. 12 is a perspective view showing a semiconductor device according to a third modification of the first embodiment.
Figure 13:
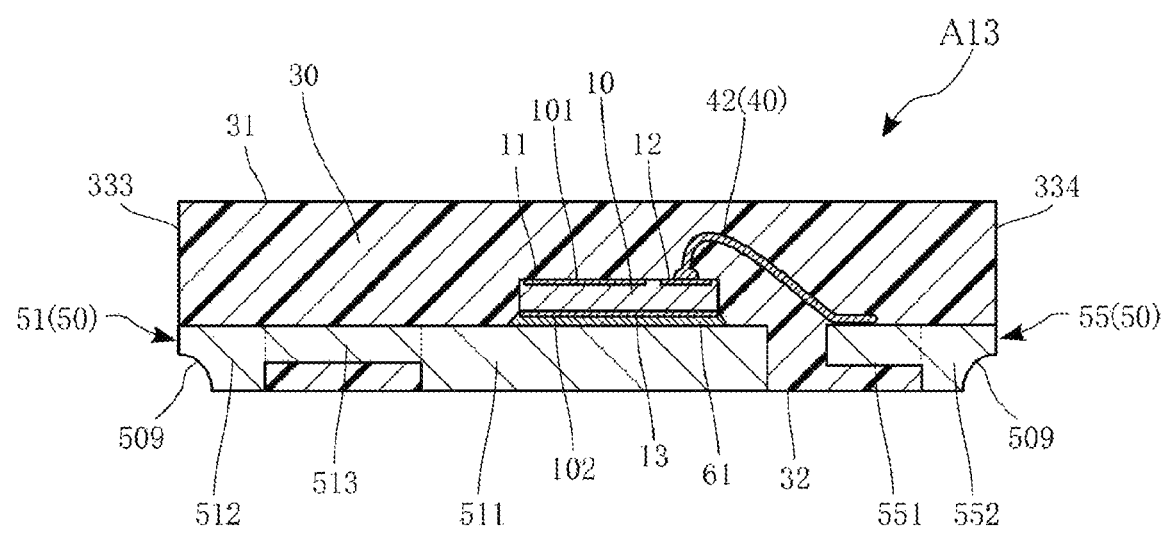
FIG. 13 is a cross-sectional view showing a semiconductor device according to a third modification of the first embodiment.

FIGS. 12 and 13 show a semiconductor device A13 according to a third modification of the semiconductor device A10. FIG. 12 is a perspective view showing the semiconductor device A13. FIG. 13 is a cross-sectional view showing the semiconductor device A13 and corresponds to the cross section of the semiconductor device A10 shown in FIG. 5. The semiconductor device A13 differs from the semiconductor device A10 in that recess portions are formed in the sealing resin 30 and the lead frame 50.

In this modification, the sealing resin 30 has a recess 309. The recess 309 is recessed from the resin back surface 32 in the z direction and is recessed from the resin side surfaces 331 to 334 in the x direction or the y direction.

In this modification, each terminal portion 512, the terminal portion 522, each terminal portion 532, the terminal portion 542, the terminal portion 552, and the terminal portion 562 have a recess 509. The recess 509 is recessed in the z direction from the surface facing the z1 direction in each terminal portion 512, the terminal portion 522, each terminal portion 532, the terminal portion 542, the terminal portion 552, and the terminal portion 562, and is recessed in the x direction from the surface exposed from the sealing resin 30.

The recess 309 formed on the resin side surface 333 and the recess 509 formed in each terminal portion 512, the terminal portion 542, and the terminal portion 562 entirely overlap with each other when viewed in the y direction. In addition, the recess 309 formed on the resin side surface 334 and the recess 509 formed in each terminal portion 532, the terminal portion 522, and the terminal portion 552 entirely overlap with each other when viewed in the y direction.

According to the semiconductor device A13, as in the semiconductor device A10, it is possible to reduce the parasitic inductance in the loop Lp. Therefore, as in the semiconductor device A10, the semiconductor device A13 suppresses the noise components (the aforementioned conduction noise and radiation noise) in the power conversion device B1.

According to the semiconductor device A13, the recess 309 and the recess 509 are formed on the back surface (the surface facing the z1 direction) side of the semiconductor device A13. The semiconductor device A13 is mounted in a posture in which the above-described back surface faces the circuit board BC. The semiconductor device A13 is bonded to the circuit board BC by a conductive bonding material such as solder or the like. According to this configuration, when the semiconductor device A13 is mounted on the circuit board BC using the above-described conductive bonding material, a fillet may be formed in the recess 309 by the above-described conductive bonding material. Therefore, by forming the fillet, it can be visually confirmed from the lateral side of the semiconductor device A13 whether the conductive bonding material is properly formed. Accordingly, it is not necessary to use an x-ray inspection apparatus or the like to confirm whether the conductive bonding material is properly formed. Thus, it is possible to suppress an increase in cost during product inspection.

Figure 14:
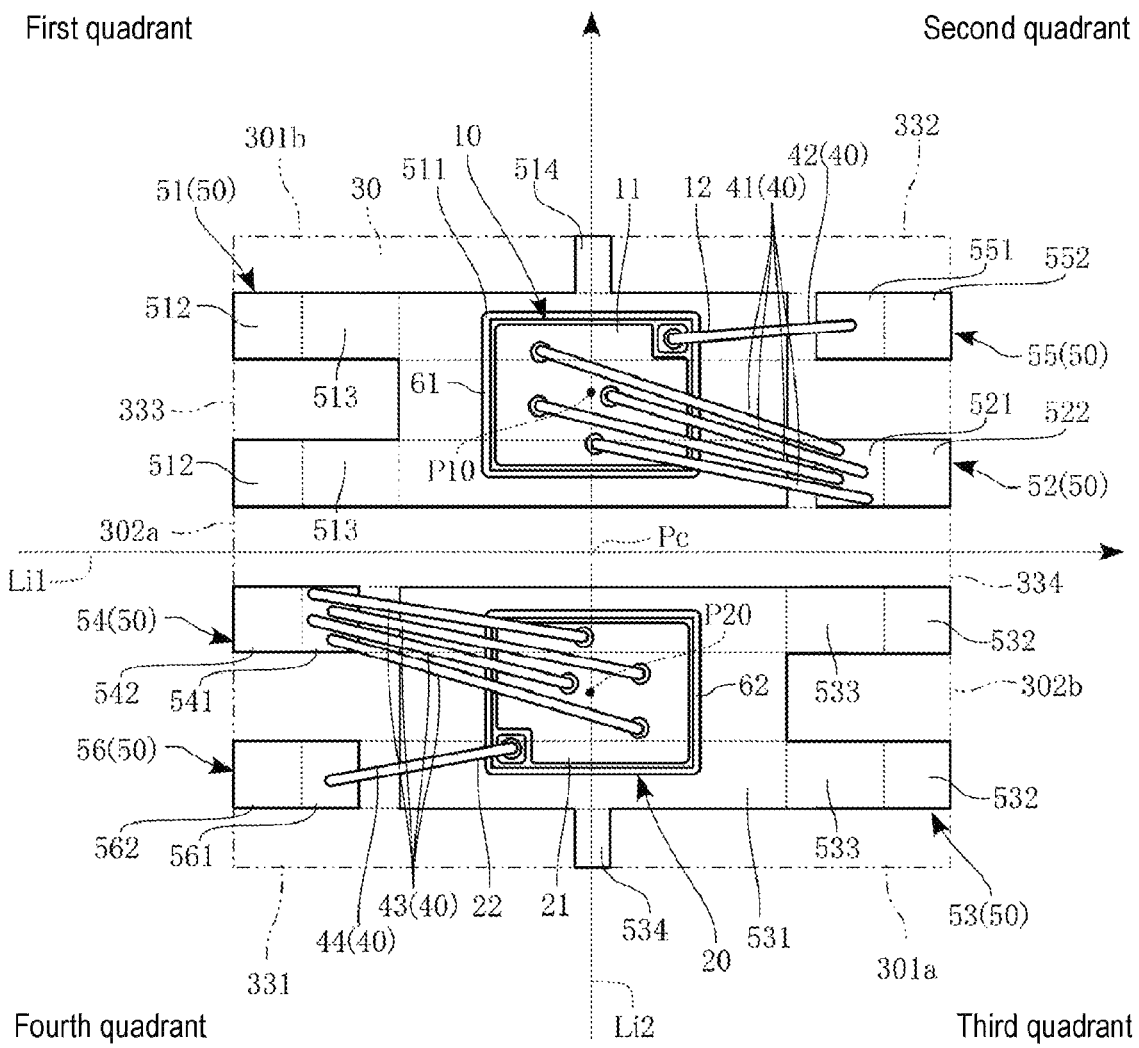
FIG. 14 is a plan view showing a semiconductor device when the arrangement of semiconductor elements is changed.

In the first embodiment and the modifications thereof, the arrangement of the semiconductor elements 10 and 20 is not limited to the illustrated positions. The semiconductor element 10 only needs to be disposed on the island portion 511, and the semiconductor element 20 only needs to be disposed on the island portion 531. FIG. 14 shows an example in which the arrangement of the semiconductor elements 10 and 20 is changed in the semiconductor device A10. In the example shown in FIG. 14, the semiconductor element 10 and the semiconductor element 20 entirely overlap with each other when viewed in the y direction. Accordingly, the center point P10 of the semiconductor element 10 and the center point P20 of the semiconductor element 20 overlap with each other when viewed in the y direction.

In the first embodiment and the modifications thereof, there has been shown the case where each terminal portion 512 is connected to the island portion 511 via the connecting portion 513 in the first lead 51. However, the present disclosure is not limited thereto. For example, the connecting portion 513 may not be provided, and each terminal portion 512 may be spaced apart from the island portion 511. In this case, each terminal portion 512 and the island portion 511 need to be electrically connected by a bonding wire, a bonding ribbon, a plate-shaped metal member (clip), or the like. Furthermore, when the semiconductor element 10 is a MOSFET having a horizontal structure, i.e., when the source electrode 11, the gate electrode 12, and the drain electrode 13 are exposed from the main surface 101, the drain electrode 13 and the terminal portion 512 may be electrically connected by a bonding wire, a bonding ribbon, a plate-shaped metal member (clip), or the like. In this case, instead of the conductive bonding material 61, a bonding material having no conductivity may be used.

In the first embodiment and the modifications thereof, there has been shown the case where each terminal portion 532 is connected to the island portion 531 via the connecting portion 533 in the third lead 53. However, the present disclosure is not limited thereto. For example, the connecting portion 533 may not be provided, and each terminal portion 532 may be spaced apart from the island portion 531. In this case, each terminal portion 532 and the island portion 531 need to be electrically connected by a bonding wire, a bonding ribbon, a plate-shaped metal member (clip), or the like. Furthermore, when the semiconductor element 20 is a horizontal type, i.e., when the source electrode 21, the gate electrode 22, and the drain electrode 23 are exposed from the main surface 201, the drain electrode 23 and the terminal portion 532 may be electrically connected by a bonding wire, a bonding ribbon, a plate-shaped metal member (clip), or the like. In this case, instead of the conductive bonding material 62, a bonding material having no conductivity may be used.

Second Embodiment

Figure 15:
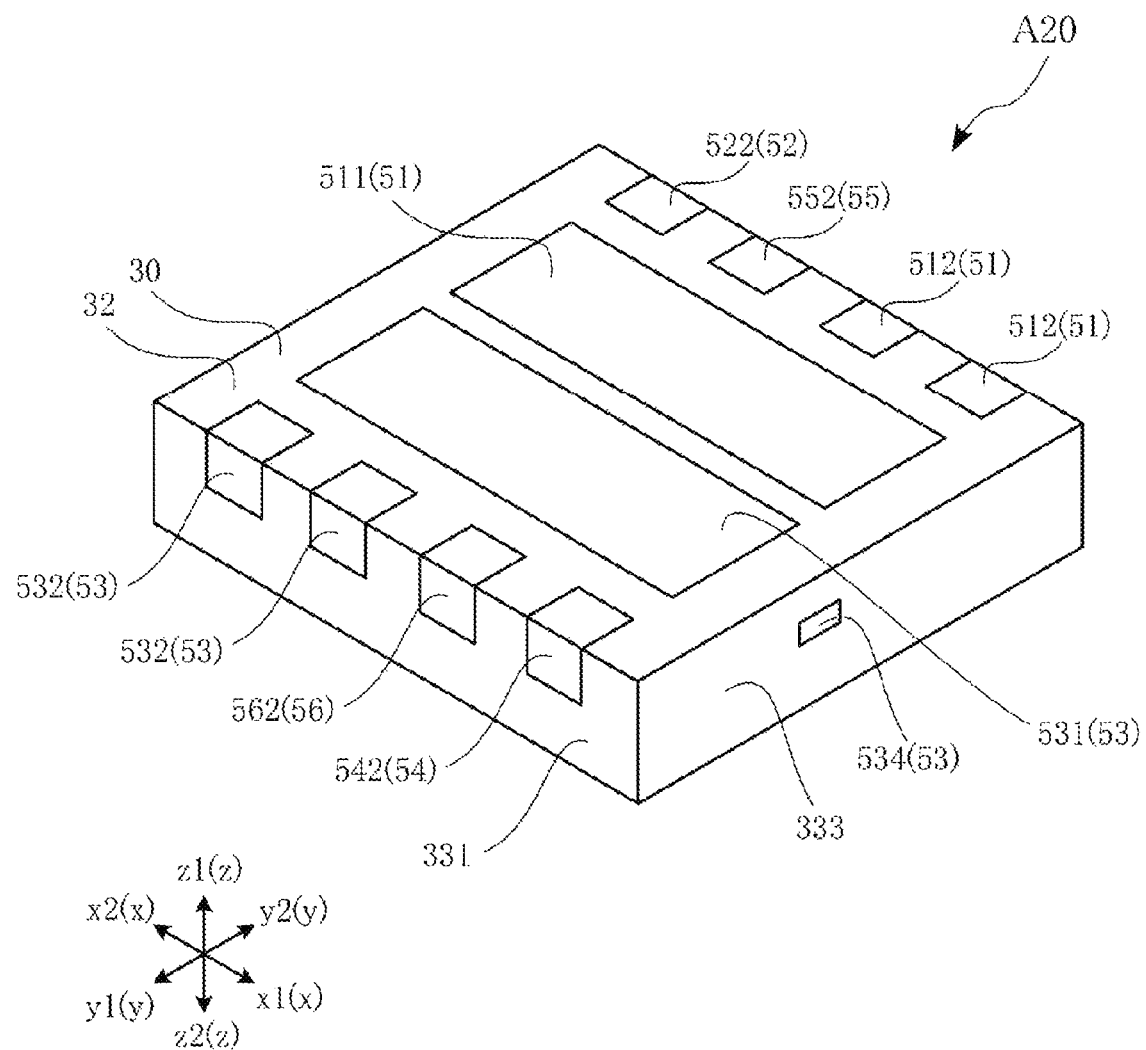
FIG. 15 is a perspective view showing a semiconductor device according to a second embodiment.
Figure 16:
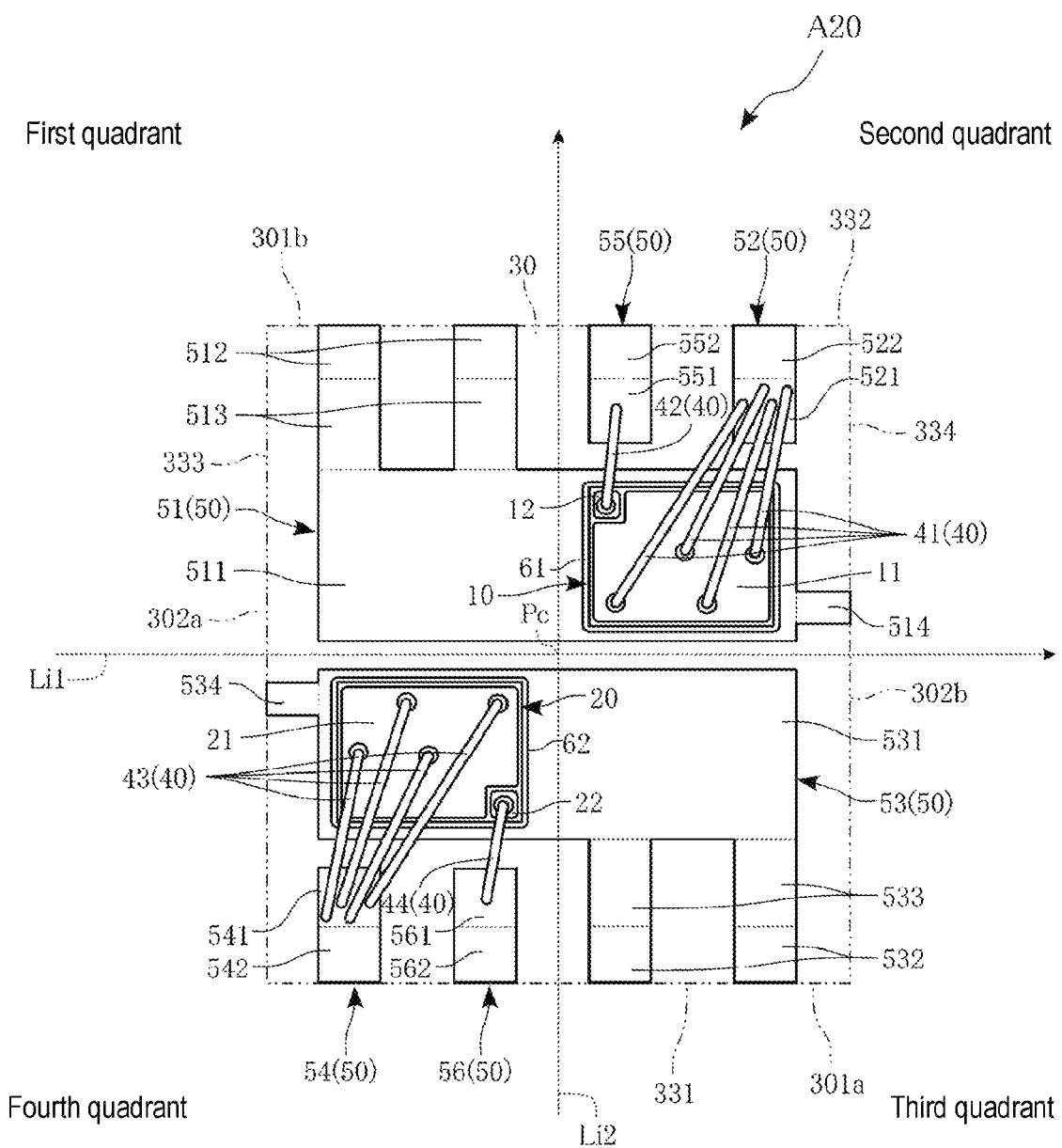
FIG. 16 is a plan view showing the semiconductor device according to the second embodiment.

FIGS. 15 and 16 show a semiconductor device A20 according to a second embodiment. FIG. 15 is a perspective view showing the semiconductor device A20. FIG. 16 is a plan view showing the semiconductor device A20, in which the sealing resin 30 is indicated by an imaginary line.

As shown in FIGS. 15 and 16, the semiconductor device A20 of the second embodiment differs from the semiconductor device A10 in terms of the configuration of the lead frame 50.

As shown in FIG. 16, each terminal portion 512 extends from an end edge in the y2 direction of the island portion 511 that is closer to the x1 direction via each connecting portion 513. Each terminal portion 532 extends from an end edge in the y1 direction of the island portion 531 that is closer to the x2 direction via each connecting portion 533.

As shown in FIG. 16, each terminal portion 512, the terminal portion 552, and the terminal portion 522 are arranged along the first edge 301b. As shown in FIG. 15 and FIG. 16, each terminal portion 512, the terminal portion 552, and the terminal portion 522 are exposed from the resin side surface 332. These are exposed at the first end edge 301b. In the present embodiment, in each terminal portion 512, the terminal portion 552 and the terminal portion 522, an end surface facing the y2 direction is exposed from the resin side surface 332 and is flush with the resin side surface 332. Alternatively, each terminal portion 512, the terminal portion 552, and the terminal portion 522 may protrude from the resin side surface 332 in a plan view.

As shown in FIG. 16, each terminal portion 512, the terminal portion 552, and the terminal portion 522 overlap with each other when viewed in the x direction. Furthermore, each terminal portion 512, the terminal portion 552, and the terminal portion 522 are arranged in this order from the x1 direction side to the x2 direction. Accordingly, the two terminal portions 512 and the terminal portion 522 are arranged on the opposite sides in the x direction with the terminal portion 552 interposed therebetween, and the terminal portion 552 is arranged between the two terminal portions 512 and the terminal portion 522 in the x direction.

As shown in FIG. 16, each terminal portion 532, the terminal portion 562, and the terminal portion 542 are arranged along the first end edge 301a. As shown in FIGS. 15 and 16, each terminal portion 532, the terminal portion 562, and the terminal portion 542 are exposed from the resin side surface 331. These are exposed at the first end edge 301a. In the present embodiment, in each terminal portion 532, the terminal portion 562, and the terminal portion 542, an end surface facing the y1 direction is exposed from the resin side surface 331 and is flush with the resin side surface 331. Alternatively, each terminal portion 532, the terminal portion 562, and the terminal portion 542 may protrude from the resin side surface 331 in a plan view.

As shown in FIG. 16, each terminal portion 532, the terminal portion 562, and the terminal portion 542 overlap with each other when viewed in the x direction. Each terminal portion 532, the terminal portion 562, and the terminal portion 542 are arranged in this order from the x2 direction side to the x1 direction. Accordingly, the two terminal portions 532 and the terminal portion 542 are disposed on the opposite sides in the x direction with the terminal portion 562 interposed therebetween, and the terminal portion 562 is disposed between the two terminal portions 532 and the terminal portion 542 in the x direction.

Both the two terminal portions 512 and the terminal portion 522 overlap with the island portion 511 when viewed in the y direction. The terminal portion 552 also overlaps with the island portion 511 when viewed in the y direction. Furthermore, both the two terminal portions 532 and the terminal portion 542 overlap with the island portion 531 when viewed in the y direction. The terminal portion 562 also overlaps with the island portion 531 when viewed in the y direction.

As shown in FIG. 16, one of the two terminal portions 512 and the terminal portion 542 overlap with each other when viewed in the y direction, and the other of the two terminal portions 512 and the terminal portion 562 overlap with each other when viewed in the y direction. One of the two terminal portions 532 and the terminal portion 522 overlap with each other when viewed in the y direction, and the other of the two terminal portions 532 and the terminal portion 552 overlap with each other when viewed in the y direction.

As shown in FIG. 16, the extension portion 514 of the first lead 51 extends in the x2 direction from the end edge of the island portion 511 in the x2 direction. The arrangement of the extension portion 514 is not limited thereto. The extension portion 514 may extend in the x1 direction from the end edge of the island portion 511 in the x1 direction, or may extend from each of the end edge in the x1 direction and the end edge in the x2 direction of the island portion 511. Furthermore, as shown in FIG. 16, the extension portion 534 of the third lead 53 extends in the x1 direction from the end edge of the island portion 531 in the x1 direction. The arrangement of the extension portion 534 is not limited thereto. The extension portion 534 may extend in the x2 direction from the end edge of the island portion 531 in the x2 direction, or may extend from each of the end edge in the x1 direction and the end edge in the x2 direction of the island portion 531.

Also in the lead frame 50 according to the present embodiment, as shown in FIG. 16, when four quadrants divided by the imaginary lines Li1 and Li2 are defined as in the lead frame 50 according to the first embodiment, the two terminal portions 512 are disposed in the first quadrant, the terminal portion 522 is disposed in the second quadrant, the two terminal portions 532 are disposed in the third quadrant, and the terminal portion 542 is disposed in the fourth quadrant. Furthermore, the terminal portion 552 is disposed in the second quadrant, and the terminal portion 562 is disposed in the fourth quadrant.

As shown in FIG. 16, the two terminal portions 512 are located on the opposite side of the terminal portion 522 and the terminal portion 552 across the imaginary line Li2 in the x direction. The terminal portion 522 and the terminal portion 552 are located on the opposite side of the two terminal portions 532 across the imaginary line Li1 in the y direction. The two terminal portions 532 are located on the opposite side of the terminal portion 542 and the terminal portion 562 across the imaginary line Li2 in the x direction. The terminal portion 542 and the terminal portion 562 are located on the opposite side of the two terminal portions 512 across the imaginary line Li1 in the y direction. Therefore, if it is assumed that the region where the two terminal portions 512 are located is the first quadrant, the terminal portion 522 and the terminal portion 552 are located in the second quadrant as described above. Since the terminal portion 522 and the terminal portion 552 are located in the second quadrant, the two terminal portions 532 are located in the third quadrant. Since the two terminal portions 532 are located in the third quadrant, the terminal portion 542 and the terminal portion 562 are located in the fourth quadrant.

As shown in FIG. 16, the semiconductor element 10 is entirely arranged in the second quadrant, and is located on the y1 direction side of the terminal portion 522 (second lead 52) and the terminal portion 552 (fifth lead 55) in a plan view. The semiconductor element 20 is entirely arranged in the fourth quadrant, and is located on the y2 direction side of the terminal portion 542 (fourth lead 54) and the terminal portion 562 (sixth lead 56).

Next, a power conversion device B2 including the semiconductor device A20 will be described. The circuit configuration of the power conversion device B2 is the same as the circuit configuration of the power conversion device B1 (see FIG. 7).

Figure 17:
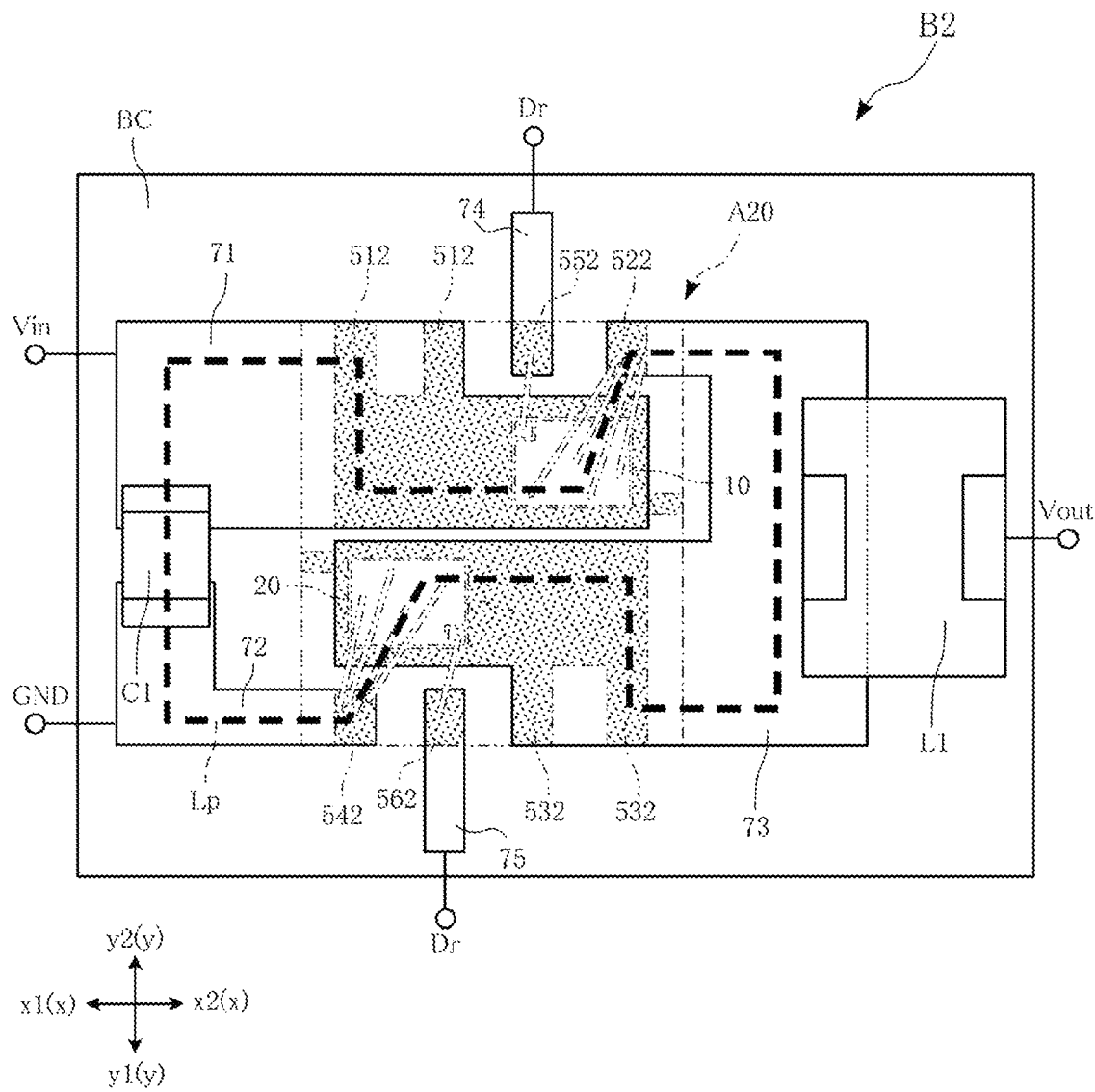
FIG. 17 is a layout diagram of a circuit board of a power conversion device according to a second embodiment.

FIG. 17 is a layout diagram of the circuit board of the power conversion device B2 using the semiconductor device A20, and shows a component layout and a wiring layout. FIG. 17 is a schematic diagram and does not show all electronic components and wiring patterns. In FIG. 17, the semiconductor device A20 is indicated by an imaginary line (two-dot chain line), and the lead frame 50 is hatched.

The circuit board BC of the power conversion device B2 further includes a fourth wiring pattern 74 and a fifth wiring pattern 75, in addition to the first wiring pattern 71, the second wiring pattern 72 and the third wiring pattern 73.

The fourth wiring pattern 74 electrically connects the terminal portion 552 (gate terminal) of the semiconductor element 10 and the drive circuit Dr. The fourth wiring pattern 74 is a gate wiring connected to the terminal portion 552 (gate terminal) of the semiconductor element 10.

The fifth wiring pattern 75 electrically connects the terminal portion 562 (gate terminal) of the semiconductor element 20 and the drive circuit Dr. The fifth wiring pattern 75 is a gate wiring connected to the terminal portion 562 (gate terminal) of the semiconductor element 20.

According to the semiconductor device A20, the terminal portion 512 is disposed in the first quadrant, the terminal portion 522 is disposed in the second quadrant, the terminal portion 532 is disposed in the third quadrant, and the terminal portion 542 is disposed in the fourth quadrant. That is, the terminal portion 512 and the terminal portion 522 are arranged side by side in the x direction, the terminal portion 522 and the terminal portion 532 are arranged side by side in the y direction, the terminal portion 532 and the terminal portion 542 are arranged side by side in the x direction, and the terminal portion 542 and the terminal portion 512 are arranged side by side in the y direction. Therefore, the terminal portion 512 and the terminal portion 542 may be arranged next to each other in the y direction, and the terminal portion 532 and the terminal portion 522 may be arranged next to each other in the y direction. According to this configuration, as shown in FIG. 17, in the circuit board BC, it is possible to shorten a distance of the first wiring pattern 71 that connects the terminal portion 512 and the terminal portion 542, and a distance of the second wiring pattern 72 that connects the terminal portion 532 and the terminal portion 522. Therefore, as in the semiconductor device A10, the semiconductor device A20 can suppress the parasitic inductance in the loop Lp. Accordingly, as with the semiconductor device A10, the semiconductor device A20 suppresses the noise components (the aforementioned conduction noise and radiation noise) in the power conversion device B2.

According to the semiconductor device A20, each terminal portion 512 is exposed from the first end edge 301*b*, and the terminal portion 542 is exposed from the first end edge 301*a*. According to this configuration, a distance between the terminal portion 512 and the terminal portion 542 can be increased. This makes it possible to suppress a short circuit between these terminals. Furthermore, the terminal portion 552 is disposed between the two terminal portions 512 and the terminal portion 522 in a plan view. According to this configuration, it is possible to suppress a short circuit between the terminal portion 512 and the terminal portion 522. Furthermore, the terminal portion 562 is disposed between the two terminal portions 532 and the terminal portion 542 in a plan view. According to this configuration, it is possible to suppress the short circuit between each terminal portion 532 and the terminal portion 542.

According to the semiconductor device A20, each terminal portion 512, the terminal portion 522, each terminal portion 532, the terminal portion 542, the terminal portion 552, and the terminal portion 562 are exposed from one of the pair of first end edges 301*a* and 301*b*. Therefore, the terminals of the semiconductor device A20 are not exposed at the pair of second end edges 302*a* and 302*b*. Furthermore, as shown in FIG. 17, the inductor L1 is disposed at a position facing the resin side surface 333. For example, after mounting the semiconductor device A20 and the inductor L1 on the circuit board BC, an appearance inspection may be performed to determine whether the semiconductor device A20 is properly bonded by a conductive bonding material such as solder or the like. In this appearance inspection, if the inductor L1 is arranged on the side surface where the terminals of the semiconductor device A20 are exposed, the terminals may be hidden by the inductor L1 and the inspection may not be performed. Such a problem can be solved by increasing the distance between the inductor L1 and the semiconductor device A20. However, the area of the circuit board BC increases and the distance of the third wiring pattern 73 increases, so that the parasitic inductance increases. On the other hand, in the present embodiment, as described above, the inductor L1 is disposed on the resin side surface 333 where the terminals of the semiconductor device A20 are not exposed. Thus, the inductor L1 does not become an obstacle during the appearance inspection. Therefore, it becomes easy to perform the appearance inspection as to whether the semiconductor device A20 is properly bonded by a conductive bonding material such as solder or the like. That is, it becomes easy to confirm the mounting of the semiconductor device A20.

According to the semiconductor device A20, as in the semiconductor device A10, the terminal portion 552 and the terminal portion 562 are disposed outside the loop Lp. According to this configuration, as in the semiconductor device A10, the first wiring pattern 71, the second wiring pattern 72, and the third wiring pattern 73 are not formed to go around any one of the terminal portions 552 and 562, the fourth wiring pattern 74, and the fifth wiring pattern 75 when viewed in the z direction. Therefore, the semiconductor device A20 can shorten the distance between the first wiring pattern 71, the second wiring pattern 72, and the third wiring pattern 73, and can reduce the parasitic inductance thereof The second embodiment may also be configured in the same manner as each modification of the first embodiment described above. That is, in the semiconductor device A20, as shown in FIG. 9, a seventh lead 57 may be provided instead of the set of the terminal portions 512 and the connecting portions 513, or an eighth lead 58 may be provided instead of the set of the terminal portions 532 and the connecting portions 533. Furthermore, in the semiconductor device A20, as shown in FIG. 10, the two terminal portions 512 may be integrated, or the two terminal portions 532 may be integrated. Moreover, in the semiconductor device A20, as shown in FIGS. 12 and 13, a recess 309 may be provided in the sealing resin 30, or a recess 509 may be provided in each terminal portion 512, the terminal portion 522, each terminal portion 532, the terminal portion 542, the terminal portion 552, and the terminal portion 562. In addition, in the semiconductor device A20, the arrangement of the semiconductor elements 10 and 20 may be changed as shown in FIG. 14.

Modification of the Second Embodiment

Figure 18:
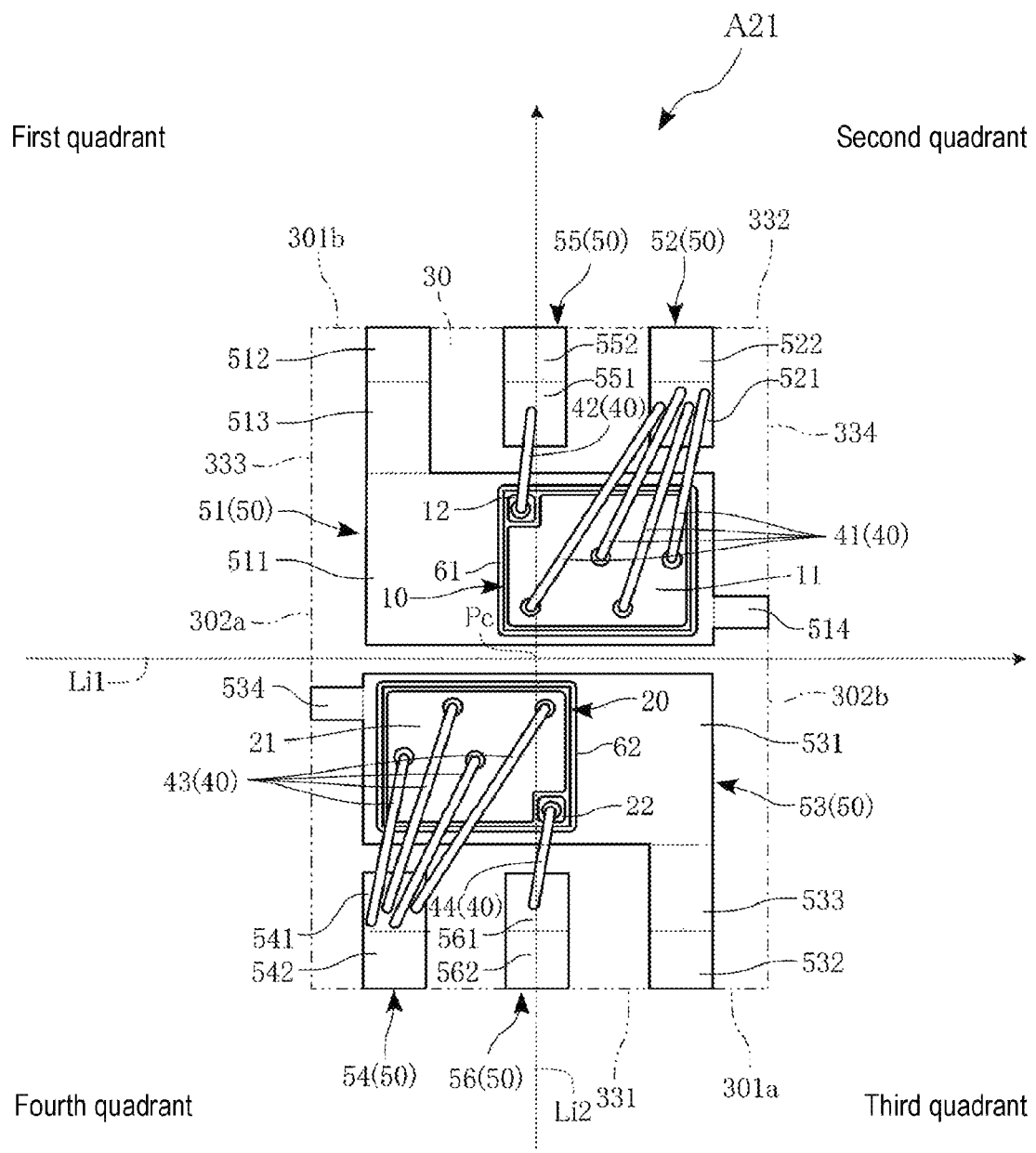
FIG. 18 is a plan view showing a semiconductor device according to a modification of the second embodiment.

FIG. 18 shows a semiconductor device A21 according to a modification of the second embodiment. FIG. 18 is a plan view showing the semiconductor device A21, in which the sealing resin 30 is indicated by an imaginary line. The semiconductor device A21 differs from the semiconductor device A20 in terms of the configuration of the first lead 51 and the third lead 53.

The first lead 51 of the semiconductor device A20 shown in FIG. 16 includes two terminal portions 512 and two connecting portions 513. However, the first lead 51 of the semiconductor device A21 includes one terminal portion 512 and one connecting portion 513 as shown in FIG. 18. Therefore, in the first lead 51 of the semiconductor device A20, two sets of the terminal portions 512 and the connecting portions 513 extend from the island portion 511. However, in the first lead 51 of the semiconductor device A21, one set of the terminal portion 512 and the connecting portion 513 extend from the island portion 511. For this reason, the island portion 511 of the semiconductor device A21 has a smaller dimension in the x direction than the island portion 511 of the semiconductor device A20.

The third lead 53 of the semiconductor device A20 shown in FIG. 16 includes two terminal portions 532 and two connecting portions 533. However, the third lead 53 of the semiconductor device A21 includes one terminal portion 532 and one connecting portion 533 as shown in FIG. 18. Therefore, in the third lead 53 of the semiconductor device A20, two sets of the terminal portions 532 and the connecting portions 533 extend from the island portion 531. However, in the third lead 53 of the semiconductor device A21, one set of the terminal portion 532 and the connecting portion 533 extend from the island portion 531. For this reason, the island portion 531 of the semiconductor device A21 has a smaller dimension in the x direction than the island portion 531 of the semiconductor device A20.

According to the semiconductor device A21, as in the semiconductor device A20, it is possible to reduce the parasitic inductance in the loop Lp. Therefore, as with the semiconductor device A20, the semiconductor device A21 can suppress the noise components (the aforementioned conduction noise and radiation noise) in the power conversion device B2.

According to the semiconductor device A21, the first lead 51 includes one terminal portion 512 and one connecting portion 513. Furthermore, the third lead 53 includes one terminal portion 532 and one connecting portion 533. Therefore, the semiconductor device A21 has fewer set of the terminal portions 512 and the connecting portions 513 and set of the terminal portions 532 and the connecting portions 533 than the semiconductor device A20. Therefore, it is possible to reduce the dimensions of the island portion 511 and the island portion 531 in the x direction. Accordingly, the semiconductor device A21 can be made smaller than the semiconductor device A20 in the x direction.

Third Embodiment

Figure 19:
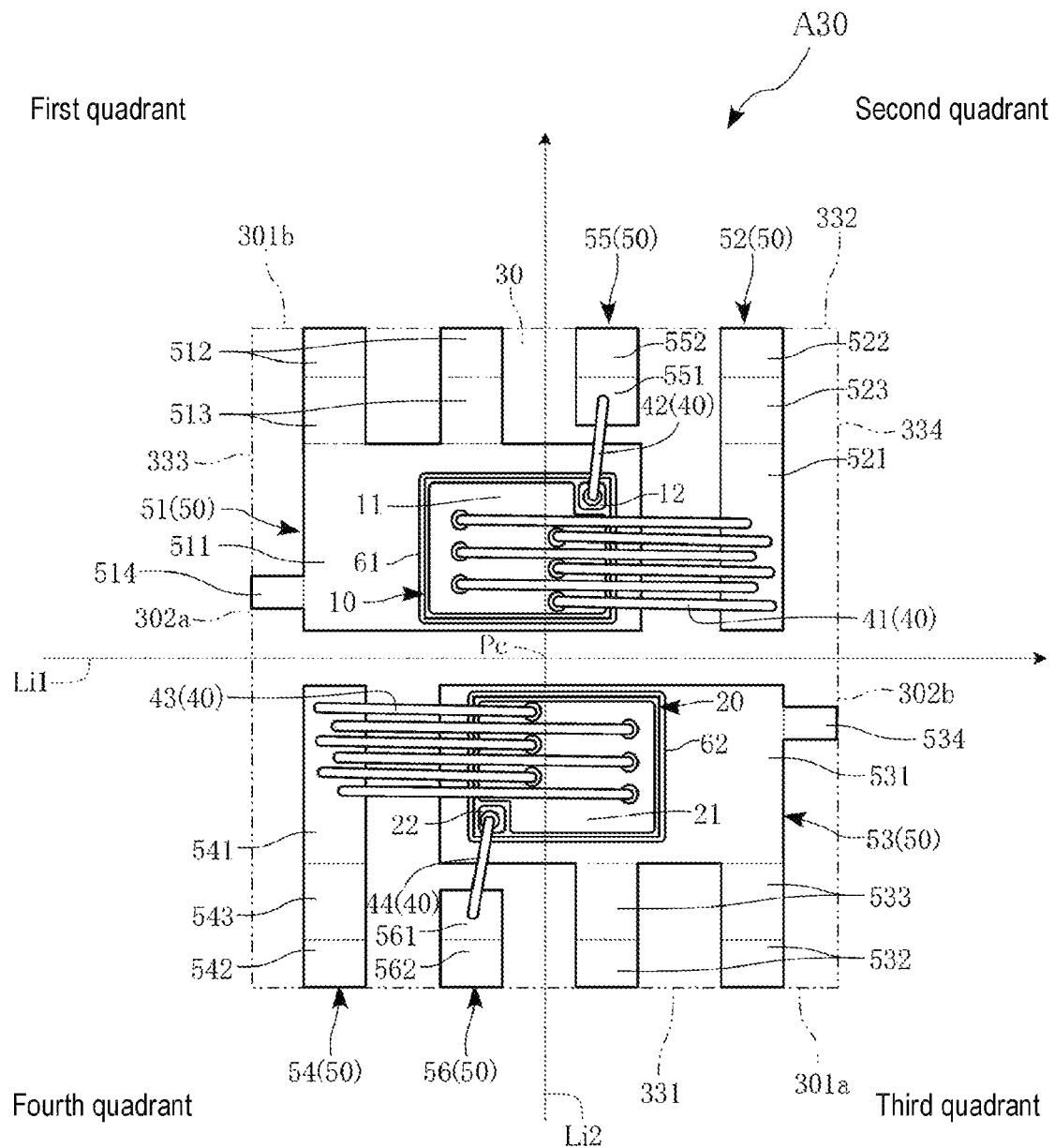
FIG. 19 is a plan view showing a semiconductor device according to a third embodiment.

FIG. 19 shows a semiconductor device A30 according to a third embodiment. FIG. 19 is a plan view showing the semiconductor device A30, in which the sealing resin 30 is indicated by an imaginary line.

As shown in FIG. 19, the semiconductor device A30 of the third embodiment differs from the semiconductor device A20 mainly in terms of the configuration of the second lead 52 and the fourth lead 54. As with the semiconductor device A20, the semiconductor device A30 is used for the power conversion device B2.

The second lead 52 includes a pad portion 521, a terminal portion 522, and a connecting portion 523. Therefore, the second lead 52 of the present embodiment further includes the connecting portion 523 as compared with the second lead 52 of the semiconductor device A20.

As shown in FIG. 19, in the second lead 52, the pad portion 521 and the terminal portion 522 are spaced apart from each other and are connected by the connecting portion 523. The pad portion 521, the terminal portion 522, and the connecting portion 523 are continuously arranged side by side in the y direction in a plan view. In the present embodiment, the second lead 52 has a rectangular shape extending in the y direction in a plan view.

As shown in FIG. 19, the pad portion 521 overlaps with the island portion 511 when viewed in the x direction. The connecting portion 523 overlaps with each connecting portion 513 when viewed in the x direction.

The fourth lead 54 includes a pad portion 541, a terminal portion 542, and a connecting portion 543. Therefore, the fourth lead 54 of the present embodiment further includes the connecting portion 543 as compared with the fourth lead 54 of the semiconductor device A20.

As shown in FIG. 19, in the fourth lead 54, the pad portion 541 and the terminal portion 542 are spaced apart from each other and are connected by the connecting portion 543. The pad portion 541, the terminal portion 542, and the connecting portion 543 are continuously arranged side by side in the y direction in a plan view. In the present embodiment, the fourth lead 54 has a rectangular shape extending in the y direction in a plan view.

As shown in FIG. 19, the pad portion 541 overlaps with the island portion 531 when viewed in the x direction. The connecting portion 543 overlaps with each connecting portion 533 when viewed in the x direction.

As shown in FIG. 19, the end edge of the island portion 511 in the x2 direction and the end edge of the fifth lead 55 in the x2 direction overlap with each other in the y direction. The end edge of the island portion 531 in the x1 direction and the end edge of the sixth lead 56 in the x1 direction overlap with each other when viewed in the y direction.

According to the semiconductor device A30, each terminal portion 512, the terminal portions 522, each terminal portion 532, and the terminal portion 542 are disposed in the same manner as those of the semiconductor device A20. Therefore, as with the semiconductor device A20, the semiconductor device A30 suppresses the noise components (the aforementioned conduction noise and radiation noise) in the power conversion device B2.

Figure 20:
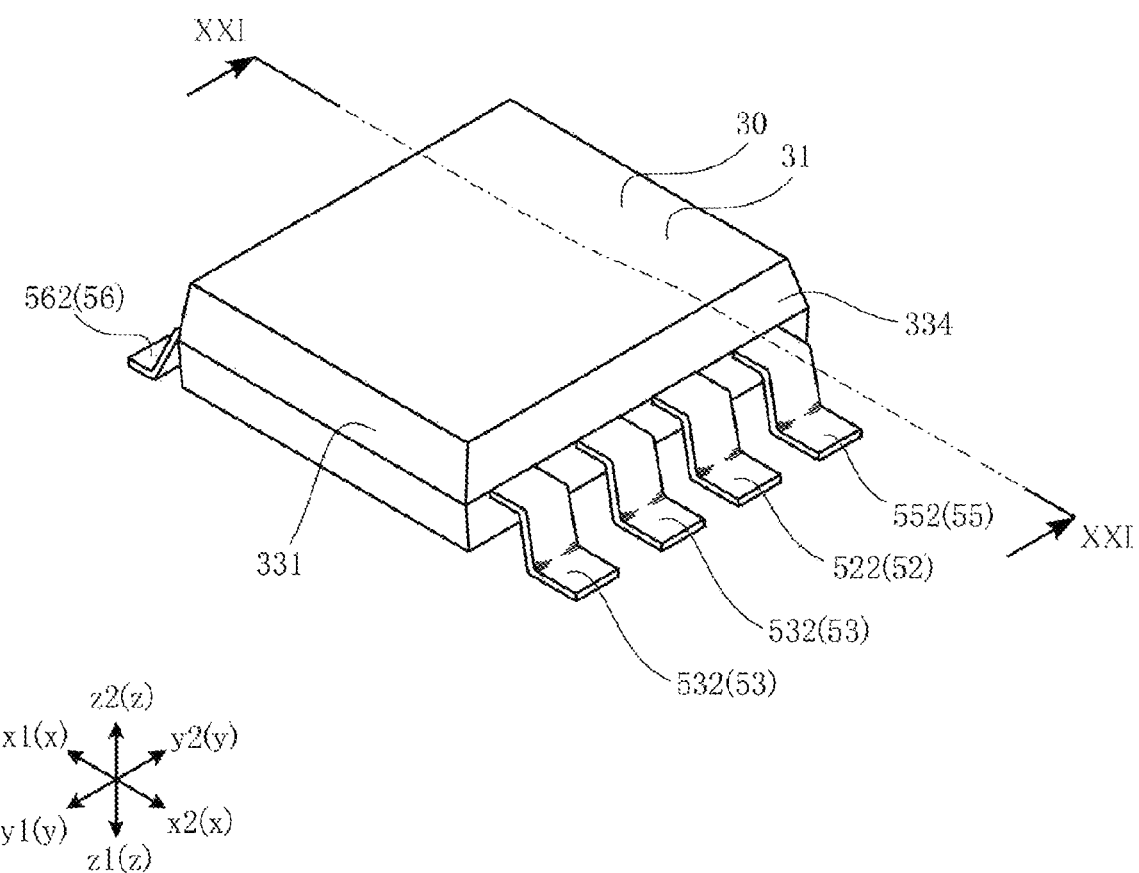
FIG. 20 is a perspective view showing a semiconductor device when a package structure is changed.
Figure 21:
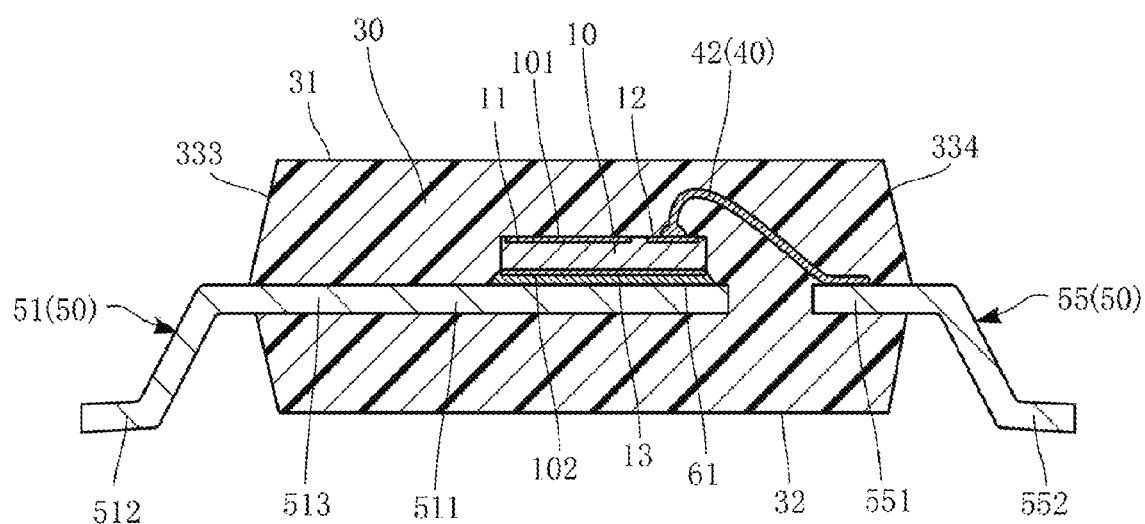
FIG. 21 is a cross-sectional view taken along line XXI-XXI in FIG. 20.

In the first to third embodiments, there has been shown the case where the semiconductor devices A10, A20, and A30 have a SON type package structure. However, the present disclosure is not limited thereto. For example, the semiconductor devices A10, A20, and A30 may have a package structure called SOP or HSOP. FIGS. 20 and 21 show a case where the semiconductor device A10 according to the first embodiment is configured to have an SOP type package structure. FIG. 20 is a perspective view showing a semiconductor device having an SOP type package structure. FIG. 21 is a cross-sectional view taken along line XXI-XXI in FIG. 20 and corresponds to the cross section of the semiconductor device A10 shown in FIG. 5. In the aspect of FIGS. 20 and 21, there is shown a case where the respective terminal portions 512, 522, 532, 542, 552, and 562 are bent in the z1 direction. However, the present disclosure is not limited thereto. The respective terminal portions 512, 522, 532, 542, 552, and 562 may be bent in the z2 direction. Furthermore, in the aspect of FIGS. 20 and 21, there is shown a case where the respective terminal portions 512, 522, 532, 542, 552 and 562 are exposed from any of the resin side surfaces 333 and 334. However, the present disclosure is not limited thereto. Alternatively, the respective terminal portions 512, 522, 532, 542, 552, and 562 may be bent in the z1 direction inside the sealing resin 30 and exposed from the resin back surface 32, or may be bent in the z2 direction inside the sealing resin 30 and exposed from the resin main surface 31.

In the first to third embodiments, there has been shown the case where the respective terminal portions 512, 522, 532, 542, 552, and 562 are exposed from any of the plurality of resin side surfaces 331 to 334 of the sealing resin 30. However, the present disclosure is not limited thereto. For example, the respective terminal portions 512, 522, 532, 542, 552, and 562 may be exposed only from the resin back surface 32 without being exposed from the plurality of resin side surfaces 331 to 334. In this case, solder balls may be formed on the regions of the terminal portions 512, 522, 532, 542, 552, and 562 exposed from the resin back surface 32, and each of the semiconductor devices A10, A20, and A30 may be configured to have a package structure called a BGA (Ball Grid Array). Alternatively, electrode pads may be formed in place of the solder balls, and each of the semiconductor devices A10, A20, and A30 may be configured to have a package structure called an LGA (Land Grid Array). Alternatively, pins which are metal-made thin connecting terminals may be formed instead of the solder balls, and each of the semiconductor devices A10, A20, and A30 may be configured to have a package structure called a PGA (Pin Grid Array).

Figure 22:
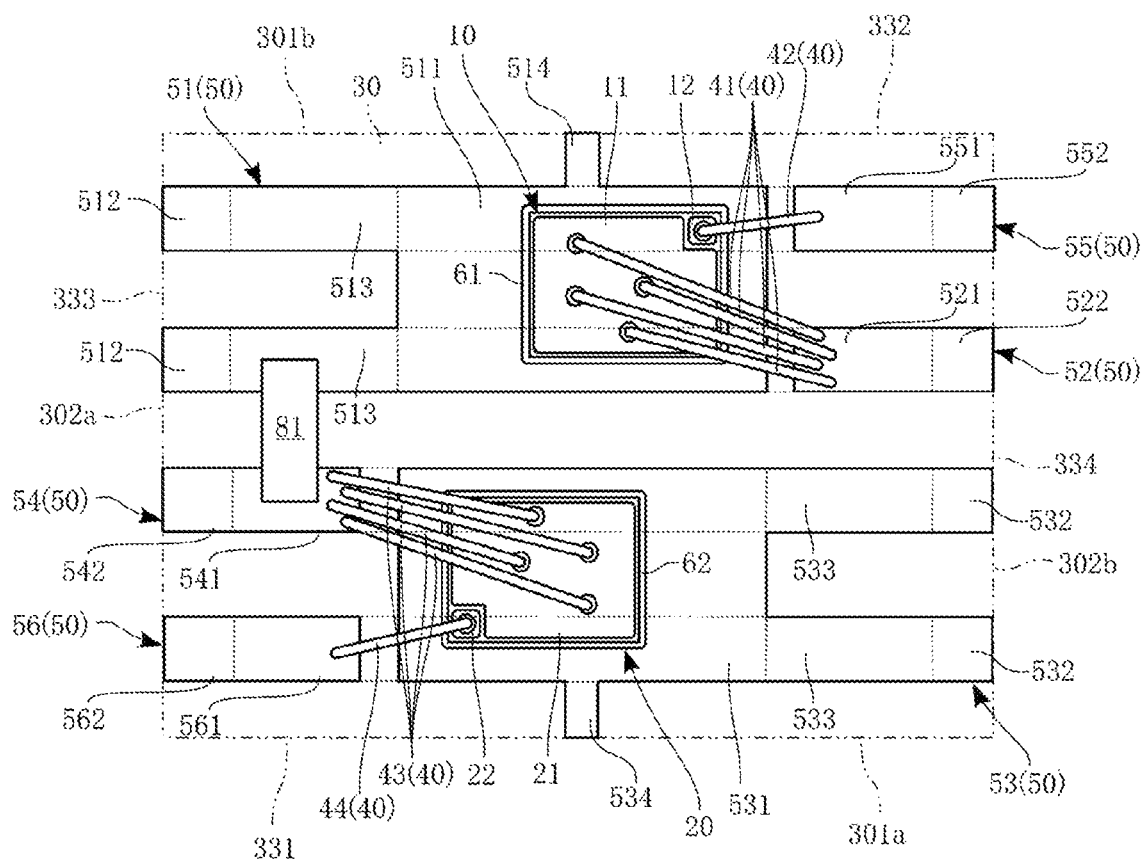
FIG. 22 is a plan view showing a semiconductor device according to a modification, in which another electronic component is added.
Figure 22:
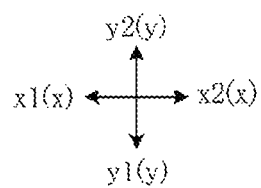
Figure 23:
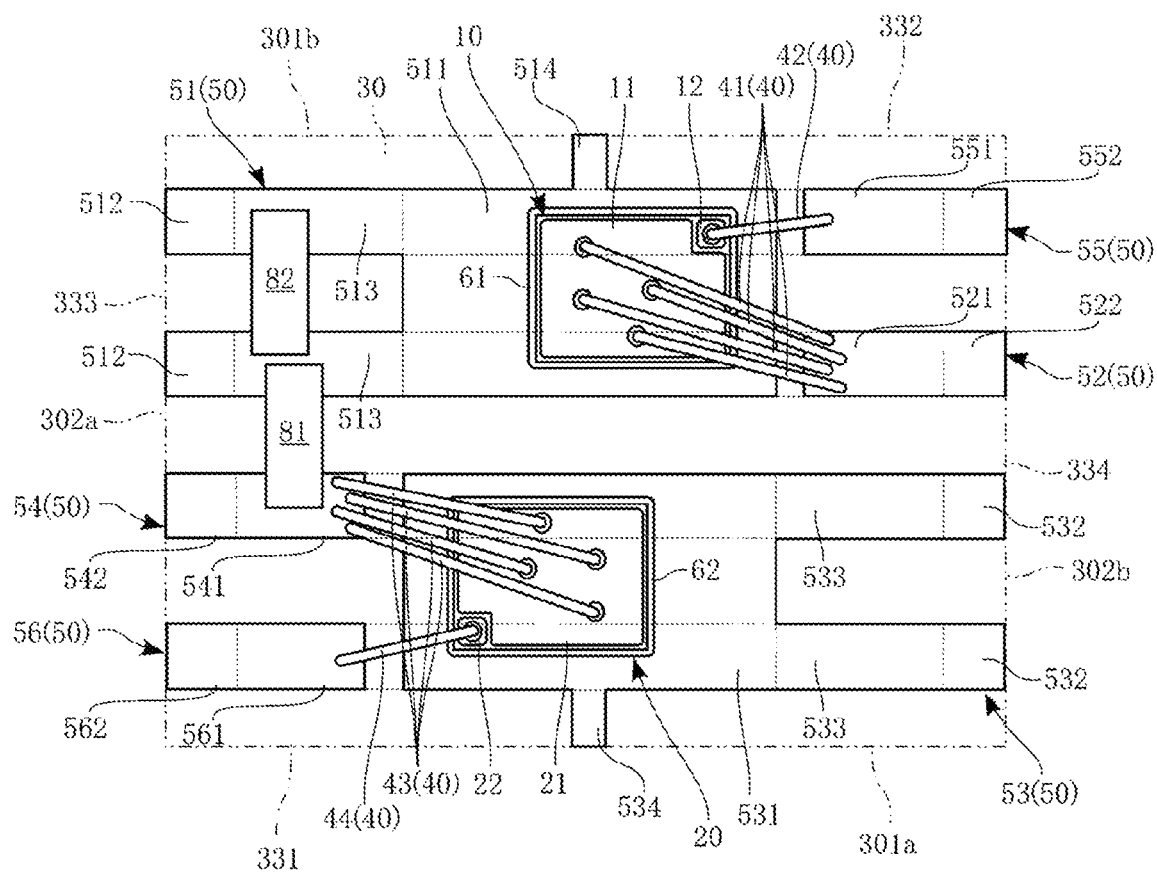
FIG. 23 is a plan view showing a semiconductor device according to a modification, in which another electronic component is added.

In the first to third embodiments, there has been shown the case where the two semiconductor elements 10 and 20 are built in the semiconductor devices A10, A20, and A30. However, electronic components different from the two semiconductor elements 10 and 20 may be further built in. That is, the two semiconductor elements 10 and 20 and the additional electronic components may be covered with the sealing resin 30. Examples of such electronic components include diodes, capacitors, inductors, resistors, ICs, and transistors different from the semiconductor elements 10 and 20. In this case, the configuration of the lead frame 50 may be changed as appropriate. Each of FIGS. 22 and 23 shows an example of a semiconductor device in which an electronic component different from the semiconductor elements 10 and 20 is further built in the sealing resin 30. FIGS. 22 and 23 are plan views showing semiconductor devices according to modifications. FIG. 22 shows a case where an electronic component 81 is built in the sealing resin 30 in the above-described semiconductor device A10 (see FIG. 2). In the aspect shown in FIG. 22, one end of the electronic component 81 is bonded to the connecting portion 513 of the first lead 51, and the other end thereof is bonded to the pad portion 541 of the fourth lead 54. The arrangement and bonding location of the electronic component 81 are not limited to those shown in FIG. 22. The electronic component 81 is, for example, a capacitor. The type of the electronic component 81 is not limited to the capacitor. In the aspect shown in FIG. 22, the electronic component 81 corresponds to the capacitor C1 shown in FIG. 7. The electronic component 81 may not be a capacitor corresponding to the capacitor C1. FIG. 23 shows a semiconductor device in which two electronic components 81 and 82 are built in the sealing resin 30 in the above-described semiconductor device A10 (see FIG. 2). In the aspect shown in FIG. 23, one end of the electronic component 81 is bonded to the connecting portion 513 of the first lead 51, and the other end thereof is bonded to the pad portion 541 of the fourth lead 54. Both ends of the electronic component 82 are bonded to the connecting portion 513 of the first lead 51. The arrangement and bonding location of each of the electronic components 81 and 82 are not limited to those shown in FIG. 23. The electronic component 81 is, for example, a capacitor, and the electronic component 82 is, for example, an EMI countermeasure component or an EMC countermeasure component (e.g., a filter circuit or the like). The types of the electronic components 81 and 82 are not limited to those described above. For example, the electronic component 82 may be bonded so as to be connected to the second lead 52 and the third lead 53.

In the first to third embodiments, there has been shown the case where the power conversion device B1 or B2 is of a synchronous rectification type. However, the power conversion device B1 or B2 may be of an asynchronous rectification type. In this case, in the semiconductor devices A10, A20, and A30, the semiconductor element 20 constituting the lower arm is constituted by a diode instead of the MOSFET. The gate terminal (terminal portion 562) electrically connected to the gate electrode 12 of the semiconductor element 20 is not used and serves as a dummy terminal. Furthermore, the terminal portion 562 (lead 56) may not be used as a dummy terminal and may not be provided.

Figure 24:
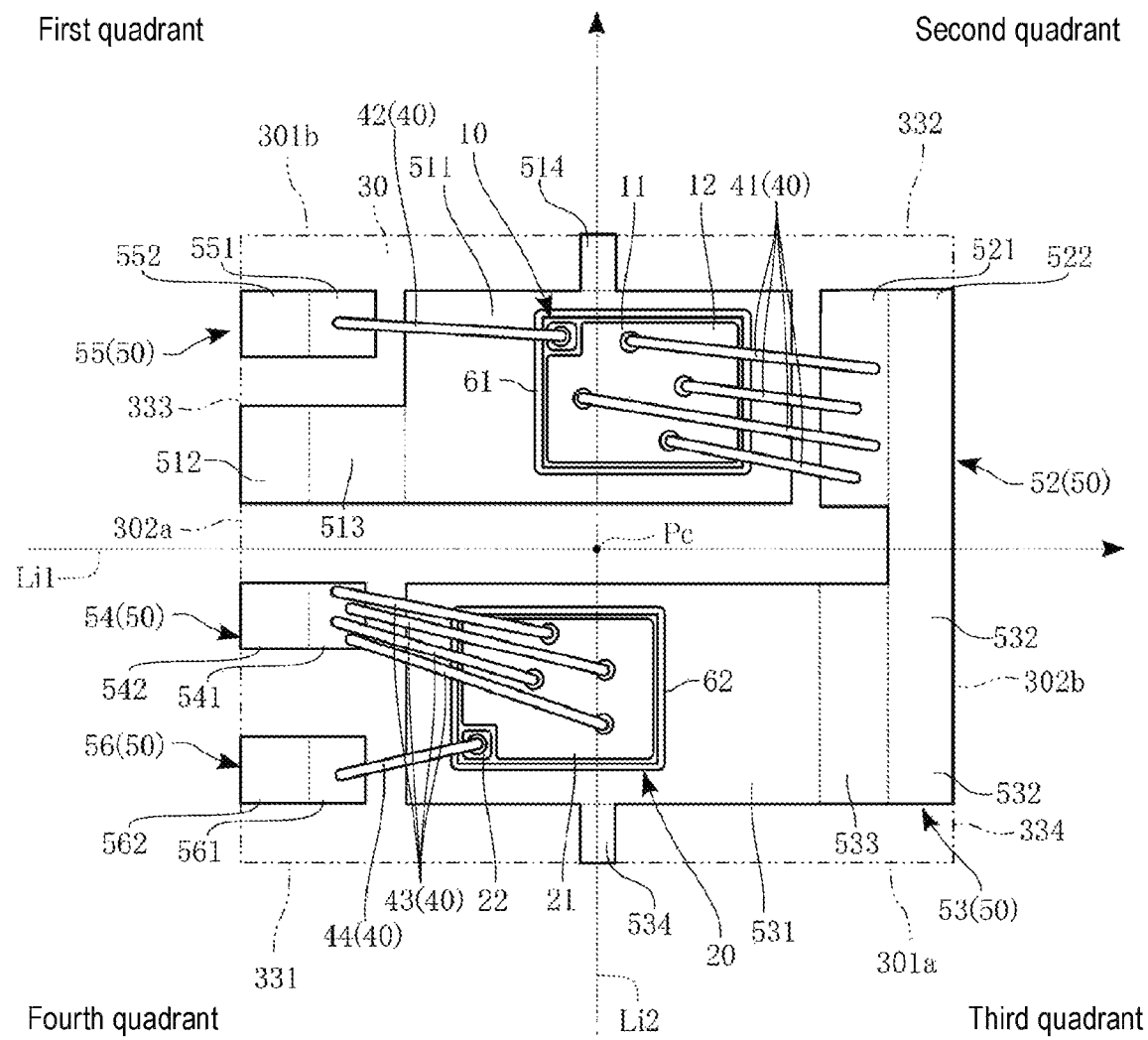
FIG. 24 is a plan view showing a semiconductor device according to a modification, in which the number of terminals exposed from a sealing resin is five.
Figure 24:
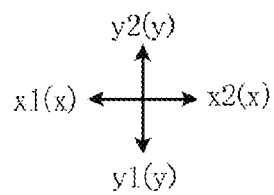

In the first to third embodiments, the number of terminals exposed from the sealing resin 30 (corresponding to the total number of terminal portions 512, 522, 532, 542, 552, and 562) is not limited to that shown in each of the embodiments. Specifically, in the above-described semiconductor device A10, as shown in FIG. 1, eight terminals (terminal portions) are exposed from the sealing resin 30. In the above-described semiconductor device A12 and semiconductor device A21, as shown in FIGS. 10 and 18, six terminals (terminal portions) are exposed from the sealing resin 30. However, the number of terminals in the semiconductor device of the present disclosure is not limited thereto. FIG. 24 shows an example of a semiconductor device when the number of terminals exposed from the sealing resin 30 is five. FIG. 24 is a plan view showing a semiconductor device according to a modification, in which the sealing resin 30 is indicated by an imaginary line. In the aspect shown in FIG. 24, the terminal portion 522 of the second lead 52 and the terminal portion 532 of the third lead 53 are integrally formed and are configured as one terminal. In an aspect differing from FIG. 24, the pad portion 521 of the second lead 52 and the connecting portion 533 of the third lead 53 may be integrally formed. In the aspect shown in FIG. 24, the set of the terminal portion 512 and the connecting portion 513 of the first lead 51 is configured as one set as compared with the semiconductor device A10. Furthermore, the fifth lead 55 is arranged not in the second quadrant but in the first quadrant. The aspect shown in FIG. 24 is an example. In addition, the size of each of the terminal portions 512, 522, 532, 542, 552, and 562 as viewed in the z direction may be reduced, and the number of terminals may be increased. Furthermore, the terminal portions 512, 522, and 552 electrically connected to the semiconductor element 10 and the terminal portions 532, 542, and 562 electrically connected to the semiconductor element 20 may be different in the number thereof so that the number of terminals becomes different. Moreover, additional leads (terminal portions) may be provided on the lead frame 50. For example, as the lead (terminal portion), a lead (terminal portion) for detecting a source current of each of the semiconductor elements 10 and 20, i.e., a source sensing lead (terminal portion), may be further provided.

In the first to third embodiments, there has been shown the case where the power conversion device B1 or B2 is a step-down converter. However, the present disclosure is not limited thereto. For example, the power conversion device B1 or B2 may be a step-up converter or a step-down/step-up converter. That is, the semiconductor devices A10, A20, and A30 may be used not only for a step-down converter but also for a step-up converter or a step-up/step-down converter.

In the first to third embodiments, there has been shown the case where the power conversion device B1 or B2 is a DC/DC converter, i.e., the case where the semiconductor device A10, A20, or A30 is used for a DC/DC converter. However, the present disclosure is not limited thereto. For example, the power conversion device B1 or B2 may be an AC/DC converter or a DC/AC inverter. That is, the semiconductor device A10, A20, or A30 may be used for an AC/DC converter, a DC/AC inverter, or the like, in addition to the DC/DC converter.

The semiconductor device and the power conversion device according to the present disclosure are not limited to the above-described embodiments. The specific configuration of each part of the semiconductor device and the power conversion device of the present disclosure may be varied in design in various ways.

The semiconductor device and the power conversion device according to the present disclosure include embodiments relating to the following supplementary notes.

[Supplementary Note 1]

A semiconductor device, comprising:

a first semiconductor element including a first electrode and a second electrode;

a second semiconductor element including a third electrode and a fourth electrode;

a sealing resin configured to cover the first semiconductor element and the second semiconductor element;

a first terminal portion electrically connected to the first electrode and exposed from the sealing resin;

a second terminal portion electrically connected to the second electrode and exposed from the sealing resin;

a third terminal portion electrically connected to the third electrode and exposed from the sealing resin;

a fourth terminal portion electrically connected to the fourth electrode and exposed from the sealing resin;

a first island portion on which the first semiconductor element is mounted; and a second island portion on which the second semiconductor element is mounted, wherein when four quadrants divided by a first imaginary line extending along a second direction orthogonal to a first direction as viewed in the first direction and a second imaginary line extending along a third direction orthogonal to both the first direction and the second direction are defined, a region where the first terminal portion is disposed is defined as a first quadrant, a region adjacent to the first quadrant in the second direction is defined as a second quadrant, a region adjacent to the second quadrant in the third direction and diagonal to the first quadrant is defined as a third quadrant, and a region adjacent to the first quadrant in the third direction and adjacent to the third quadrant in the second direction is defined as a fourth quadrant, the second terminal portion is disposed in the second quadrant, the third terminal portion is disposed in the third quadrant, and the fourth terminal portion is disposed in the fourth quadrant

[Supplementary Note 2]

The semiconductor device of Supplementary Note 1, wherein the sealing resin includes a pair of first end edges each extending along the second direction as viewed in the first direction and a pair of second end edges each extending along the third direction as viewed in the first direction.

[Supplementary Note 3]

The semiconductor device of Supplementary Note 2, wherein the first imaginary line passes through a center of the second end edges, and the second imaginary line passes through a center of the first end edges.

[Supplementary Note 4]

The semiconductor device of Supplementary Note 2 or 3, further including:

a first conductive bonding material configured to bond the first semiconductor element and the first island portion, wherein the first semiconductor element includes a first main surface and a first back surface facing opposite sides in the first direction, wherein the first electrode is exposed on the first back surface, wherein the second electrode is exposed on the first main surface, wherein the first electrode and the first island portion are electrically connected to each other via the first conductive bonding material, and wherein the first terminal portion and the first island portion are connected to each other.

[Supplementary Note 5]

The semiconductor device of Supplementary Note 4, further including:

a second conductive bonding material configured to bond the second semiconductor element and the second island portion, wherein the second semiconductor element includes a second main surface and a second back surface facing opposite sides in the first direction, wherein the third electrode is exposed on the second back surface, wherein the fourth electrode is exposed on the second main surface, wherein the third electrode and the second island portion are electrically connected to each other via the second conductive bonding material, and wherein the third terminal portion and the second island portion are connected to each other.

[Supplementary Note 6]

The semiconductor device of Supplementary Note 5, wherein the first island portion and the second island portion are arranged side by side in the third direction.

[Supplementary Note 7]

The semiconductor device of Supplementary Note 6, wherein the first semiconductor element is mounted on the first island portion on a side on which the second terminal portion is disposed in the second direction when viewed in the first direction; and wherein the second semiconductor element is mounted on the second island portion on a side on which the fourth terminal portion is disposed in the second direction when viewed in the first direction.

[Supplementary Note 8]

The semiconductor device of Supplementary Note 6 or 7, wherein the first terminal portion and the second terminal portion overlap with each other when viewed in the second direction, and wherein the third terminal portion and the fourth terminal portion overlap with each other when viewed in the second direction.

[Supplementary Note 9]

The semiconductor device of Supplementary Note 8, further including:

a fifth terminal portion and a sixth terminal portion each exposed from the sealing resin, wherein the first semiconductor element further includes a fifth electrode, wherein the second semiconductor element further includes a sixth electrode, wherein the fifth terminal portion is electrically connected to the fifth electrode, and wherein the sixth terminal portion is electrically connected to the sixth electrode.

[Supplementary Note 10]

The semiconductor device of Supplementary Note 9, wherein the fifth electrode is exposed on the first main surface, and wherein the sixth electrode is exposed on the second main surface.

[Supplementary Note 11]

The semiconductor device of Supplementary Note 10, wherein the first island portion is disposed between the first terminal portion and the second terminal portion when viewed in the third direction, and wherein the second island portion is disposed between the third terminal portion and the second terminal portion when viewed in the third direction.

[Supplementary Note 12]

The semiconductor device of Supplementary Note 11, wherein the first terminal portion and the fourth terminal portion are exposed at one of the pair of second end edges, and wherein the second terminal portion and the third terminal portion are exposed at the other of the pair of second end edges.

[Supplementary Note 13]

The semiconductor device of Supplementary Note 12, wherein the first terminal portion and the fourth terminal portion overlap with each other when viewed in the third direction, and wherein the second terminal portion and the third terminal portion overlap with each other when viewed in the third direction.

[Supplementary Note 14]

The semiconductor device of Supplementary Note 13, wherein the fifth terminal portion overlaps with the second terminal portion and the third terminal portion when viewed in the third direction, and wherein the sixth terminal portion overlaps with the first terminal portion and the fourth terminal portion when viewed in the third direction.

[Supplementary Note 15]

The semiconductor device of Supplementary Note 14, wherein the second terminal portion is disposed between the third terminal portion and the fifth terminal portion, and wherein the fourth terminal portion is disposed between the first terminal portion and the sixth terminal portion.

[Supplementary Note 16]

The semiconductor device of Supplementary Note 10, wherein both the first terminal portion and the second terminal portion overlap with the first island portion when viewed in the third direction, and wherein both the third terminal portion and the fourth terminal portion overlap with the first island portion when viewed in the third direction.

[Supplementary Note 17]

The semiconductor device of Supplementary Note 16, wherein the first terminal portion and the second terminal portion are exposed at one of the pair of first end edges, and wherein the third terminal portion and the fourth terminal portion are exposed at the other of the pair of first end edges.

[Supplementary Note 18]

The semiconductor device of Supplementary Note 17, wherein the first terminal portion and the second terminal portion overlap with each other when viewed in the second direction, and wherein the third terminal portion and the fourth terminal portion overlap with each other when viewed in the second direction.

[Supplementary Note 19]

The semiconductor device of Supplementary Note 18, wherein the fifth terminal portion overlaps with the first terminal portion and the second terminal portion when viewed in the second direction, and wherein the sixth terminal portion overlaps with the third terminal portion and the fourth terminal portion when viewed in the second direction.

[Supplementary Note 20]

The semiconductor device of Supplementary Note 19, wherein the fifth terminal portion is disposed between the first terminal portion and the second terminal portion when viewed in the third direction, and wherein the sixth terminal portion is disposed between the third terminal portion and the fourth terminal portion when viewed in the third direction.

[Supplementary Note 21]

The semiconductor device of any one of Supplementary Notes 1 to 20, wherein both the first semiconductor element and the second semiconductor element are switching elements.

[Supplementary Note 22]

The semiconductor device of Supplementary Note 21, wherein the switching elements are MOSFETs.

[Supplementary Note 23]

The semiconductor device of Supplementary Note 22, wherein each of the first electrode and the third electrode is a drain electrode, and each of the second electrode and the fourth electrode is a source electrode.

[Supplementary Note 24]

A power conversion device, including:

the semiconductor device of any one of Supplementary Notes 1 to 23;

a capacitor connected at one end to the first terminal portion and at the other end to the fourth terminal portion, and configured to apply a voltage to between the first electrode of the first semiconductor element and the fourth electrode of the second semiconductor element;

an inductor connected to a connection point between the second electrode of the first semiconductor element and the third electrode of the second semiconductor element, and configured to smooth an output voltage from the semiconductor device;

a drive circuit configured to control switching between an on state and an off state of each of the first semiconductor element and the second semiconductor element; and a circuit board on which at least the semiconductor device, the capacitor, and the inductor are mounted.

According to the present disclosure in some embodiments, it is possible to provide a semiconductor device preferably used for a power conversion device. In addition, it is possible to provide a power conversion device including the semiconductor device.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device, comprising:
   a first semiconductor element including a first electrode and a second electrode;
   a second semiconductor element including a third electrode and a fourth electrode;
   a sealing resin configured to cover the first semiconductor element and the second semiconductor element;
   a first terminal portion electrically connected to the first electrode and exposed from the sealing resin;
   a second terminal portion electrically connected to the second electrode and exposed from the sealing resin;
   a third terminal portion electrically connected to the third electrode and exposed from the sealing resin;
   a fourth terminal portion electrically connected to the fourth electrode and exposed from the sealing resin;
   a first island portion on which the first semiconductor element is mounted; and
   a second island portion on which the second semiconductor element is mounted,
   wherein when four quadrants divided by a first imaginary line extending along a second direction orthogonal to a first direction as viewed in the first direction and a second imaginary line extending along a third direction orthogonal to both the first direction and the second direction are defined, a region where the first terminal portion is disposed is defined as a first quadrant, a region adjacent to the first quadrant in the second direction is defined as a second quadrant, a region adjacent to the second quadrant in the third direction and diagonal to the first quadrant is defined as a third quadrant, and a region adjacent to the first quadrant in the third direction and adjacent to the third quadrant in the second direction is defined as a fourth quadrant, the second terminal portion is disposed in the second quadrant, the third terminal portion is disposed in the third quadrant, and the fourth terminal portion is disposed in the fourth quadrant.

2. The semiconductor device of claim 1, wherein the sealing resin includes a pair of first end edges each extending along the second direction as viewed in the first direction and a pair of second end edges each extending along the third direction as viewed in the first direction.

3. The semiconductor device of claim 2, wherein the first imaginary line passes through a center of the second end edges, and the second imaginary line passes through a center of the first end edges.

4. The semiconductor device of claim 2, further comprising:
   a first conductive bonding material configured to bond the first semiconductor element and the first island portion,
   wherein the first semiconductor element includes a first main surface and a first back surface facing opposite sides in the first direction,
   wherein the first electrode is exposed on the first back surface,
   wherein the second electrode is exposed on the first main surface,
   wherein the first electrode and the first island portion are electrically connected to each other via the first conductive bonding material, and
   wherein the first terminal portion and the first island portion are connected to each other.

5. The semiconductor device of claim 4, further comprising:
   a second conductive bonding material configured to bond the second semiconductor element and the second island portion,
   wherein the second semiconductor element includes a second main surface and a second back surface facing opposite sides in the first direction,
   wherein the third electrode is exposed on the second back surface,
   wherein the fourth electrode is exposed on the second main surface,
   wherein the third electrode and the second island portion are electrically connected to each other via the second conductive bonding material, and
   wherein the third terminal portion and the second island portion are connected to each other.

6. The semiconductor device of claim 5, wherein the first island portion and the second island portion are arranged side by side in the third direction.

7. The semiconductor device of claim 6, wherein the first semiconductor element is mounted on the first island portion on a side on which the second terminal portion is disposed in the second direction when viewed in the first direction; and
   wherein the second semiconductor element is mounted on the second island portion on a side on which the fourth terminal portion is disposed in the second direction when viewed in the first direction.

8. The semiconductor device of claim 6, wherein the first terminal portion and the second terminal portion overlap with each other when viewed in the second direction, and
   wherein the third terminal portion and the fourth terminal portion overlap with each other when viewed in the second direction.

9. The semiconductor device of claim 8, further comprising:
- a fifth terminal portion and a sixth terminal portion each exposed from the sealing resin,
- wherein the first semiconductor element further includes a fifth electrode,
- wherein the second semiconductor element further includes a sixth electrode,
- wherein the fifth terminal portion is electrically connected to the fifth electrode, and
- wherein the sixth terminal portion is electrically connected to the sixth electrode.

10. The semiconductor device of claim 9, wherein the fifth electrode is exposed on the first main surface, and
- wherein the sixth electrode is exposed on the second main surface.

11. The semiconductor device of claim 10, wherein the first island portion is disposed between the first terminal portion and the second terminal portion when viewed in the third direction, and
- wherein the second island portion is disposed between the third terminal portion and the second terminal portion when viewed in the third direction.

12. The semiconductor device of claim 11, wherein the first terminal portion and the fourth terminal portion are exposed at one of the pair of second end edges, and
- wherein the second terminal portion and the third terminal portion are exposed at the other of the pair of second end edges.

13. The semiconductor device of claim 12, wherein the first terminal portion and the fourth terminal portion overlap with each other when viewed in the third direction, and
- wherein the second terminal portion and the third terminal portion overlap with each other when viewed in the third direction.

14. The semiconductor device of claim 13, wherein the fifth terminal portion overlaps with the second terminal portion and the third terminal portion when viewed in the third direction, and
- wherein the sixth terminal portion overlaps with the first terminal portion and the fourth terminal portion when viewed in the third direction.

15. The semiconductor device of claim 14, wherein the second terminal portion is disposed between the third terminal portion and the fifth terminal portion, and
- wherein the fourth terminal portion is disposed between the first terminal portion and the sixth terminal portion.

16. The semiconductor device of claim 10, wherein both the first terminal portion and the second terminal portion overlap with the first island portion when viewed in the third direction, and
- wherein both the third terminal portion and the fourth terminal portion overlap with the first island portion when viewed in the third direction.

17. The semiconductor device of claim 16, wherein the first terminal portion and the second terminal portion are exposed at one of the pair of first end edges, and
- wherein the third terminal portion and the fourth terminal portion are exposed at the other of the pair of first end edges.

18. The semiconductor device of claim 17, wherein the first terminal portion and the second terminal portion overlap with each other when viewed in the second direction, and
- wherein the third terminal portion and the fourth terminal portion overlap with each other when viewed in the second direction.

19. The semiconductor device of claim 18, wherein the fifth terminal portion overlaps with the first terminal portion and the second terminal portion when viewed in the second direction, and
- wherein the sixth terminal portion overlaps with the third terminal portion and the fourth terminal portion when viewed in the second direction.

20. The semiconductor device of claim 19, wherein the fifth terminal portion is disposed between the first terminal portion and the second terminal portion when viewed in the third direction, and
- wherein the sixth terminal portion is disposed between the third terminal portion and the fourth terminal portion when viewed in the third direction.

21. The semiconductor device of claim 1, wherein both the first semiconductor element and the second semiconductor element are switching elements.

22. The semiconductor device of claim 21, wherein the switching elements are MOSFETs.

23. The semiconductor device of claim 22, wherein each of the first electrode and the third electrode is a drain electrode, and each of the second electrode and the fourth electrode is a source electrode.

24. A power conversion device, comprising:
- the semiconductor device of claim 1;
- a capacitor connected at one end to the first terminal portion and at the other end to the fourth terminal portion, and configured to apply a voltage to between the first electrode of the first semiconductor element and the fourth electrode of the second semiconductor element;
- an inductor connected to a connection point between the second electrode of the first semiconductor element and the third electrode of the second semiconductor element, and configured to smooth an output voltage from the semiconductor device;
- a drive circuit configured to control switching between an on state and an off state of each of the first semiconductor element and the second semiconductor element; and
- a circuit board on which at least the semiconductor device, the capacitor, and the inductor are mounted.

* * * * *